(12) United States Patent
Chen

(10) Patent No.: US 8,736,331 B2
(45) Date of Patent: May 27, 2014

(54) NOISE TOLERANT CLOCK CIRCUIT WITH REDUCED COMPLEXITY

(75) Inventor: Chung-Kuang Chen, Pan Chiao (TW)

(73) Assignee: Macronix International Co., Ltd., Hsinchu (TW)

( * ) Notice: Subject to any disclaimer, the term of this patent is extended or adjusted under 35 U.S.C. 154(b) by 698 days.

(21) Appl. No.: 12/834,369

(22) Filed: Jul. 12, 2010

(65) Prior Publication Data

US 2011/0291638 A1 Dec. 1, 2011

(30) Foreign Application Priority Data

May 28, 2010 (TW) .............................. 99117296 A

(51) Int. Cl.
*H03K 3/017* (2006.01)
*H01L 35/00* (2006.01)

(52) U.S. Cl.
USPC .......................................... 327/176; 327/513

(58) Field of Classification Search
USPC ........... 327/83, 138, 172, 262, 291, 378, 513, 327/164, 176, 178
See application file for complete search history.

(56) References Cited

U.S. PATENT DOCUMENTS

| | | | | |
|---|---|---|---|---|
| 4,234,920 A | * | 11/1980 | Van Ness et al. | 714/22 |
| 4,584,494 A | * | 4/1986 | Arakawa et al. | 327/392 |
| 5,047,659 A | * | 9/1991 | Ullrich | 327/259 |
| 5,155,379 A | * | 10/1992 | Narahara | 327/292 |
| 5,498,987 A | * | 3/1996 | Nelson | 327/143 |
| 6,078,168 A | * | 6/2000 | Paolo | 323/226 |
| 7,075,353 B1 | | 7/2006 | Wan et al. | |
| 7,138,841 B1 | * | 11/2006 | Li et al. | 327/175 |
| 7,142,005 B1 | | 11/2006 | Gaboury | |
| 7,459,952 B2 | | 12/2008 | Ogita | |
| 7,940,549 B2 | * | 5/2011 | Stembridge et al. | 365/149 |
| 7,961,027 B1 | * | 6/2011 | Chen et al. | 327/291 |
| 8,060,771 B2 | * | 11/2011 | Tyrrell | 713/601 |
| 2007/0274138 A1 | * | 11/2007 | Ogiwara et al. | 365/189.09 |
| 2008/0309383 A1 | * | 12/2008 | Yada et al. | 327/141 |
| 2009/0009003 A1 | * | 1/2009 | Roth et al. | 307/75 |
| 2010/0007428 A1 | * | 1/2010 | Nezuka | 331/36 C |
| 2010/0289548 A1 | * | 11/2010 | Cheng | 327/176 |

* cited by examiner

*Primary Examiner* — Gary L Laxton
*Assistant Examiner* — Alex Torres-Rivera
(74) *Attorney, Agent, or Firm* — Haynes Beffel & Wolfeld LLP

(57) ABSTRACT

The clock circuit of an integrated circuit operates with tolerance of variation in power. A compensation circuit is powered by a supply voltage. The compensation circuit generates a compensated voltage reference, which is compensated for variation in the supply voltage. The compensated voltage reference is compared by comparison circuitry against an output of timing circuitry, to determine timing of the clock signal.

21 Claims, 35 Drawing Sheets

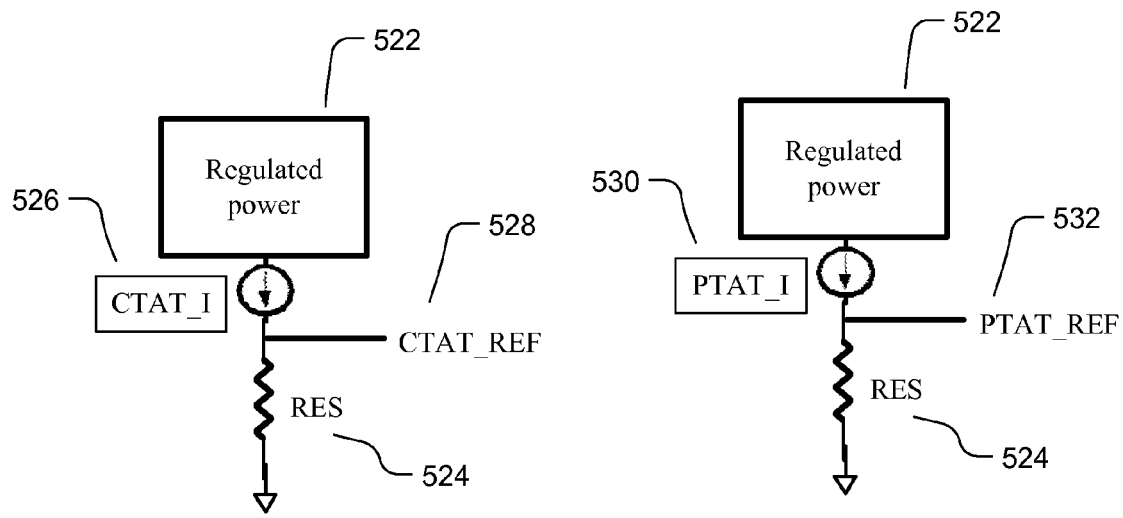
Fig. 5A     Fig. 5B
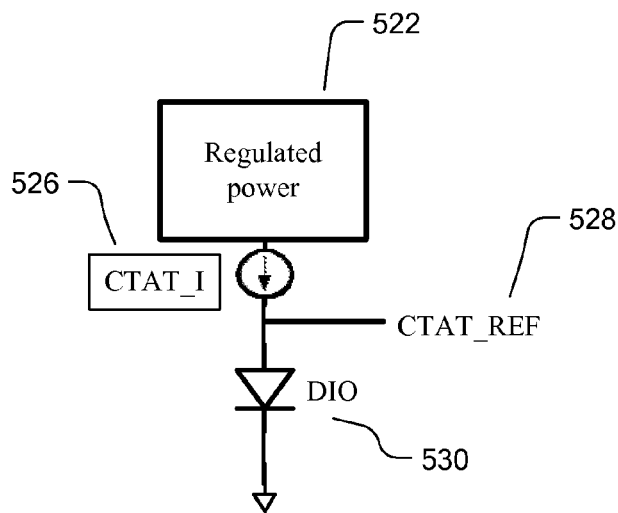
Fig. 5C

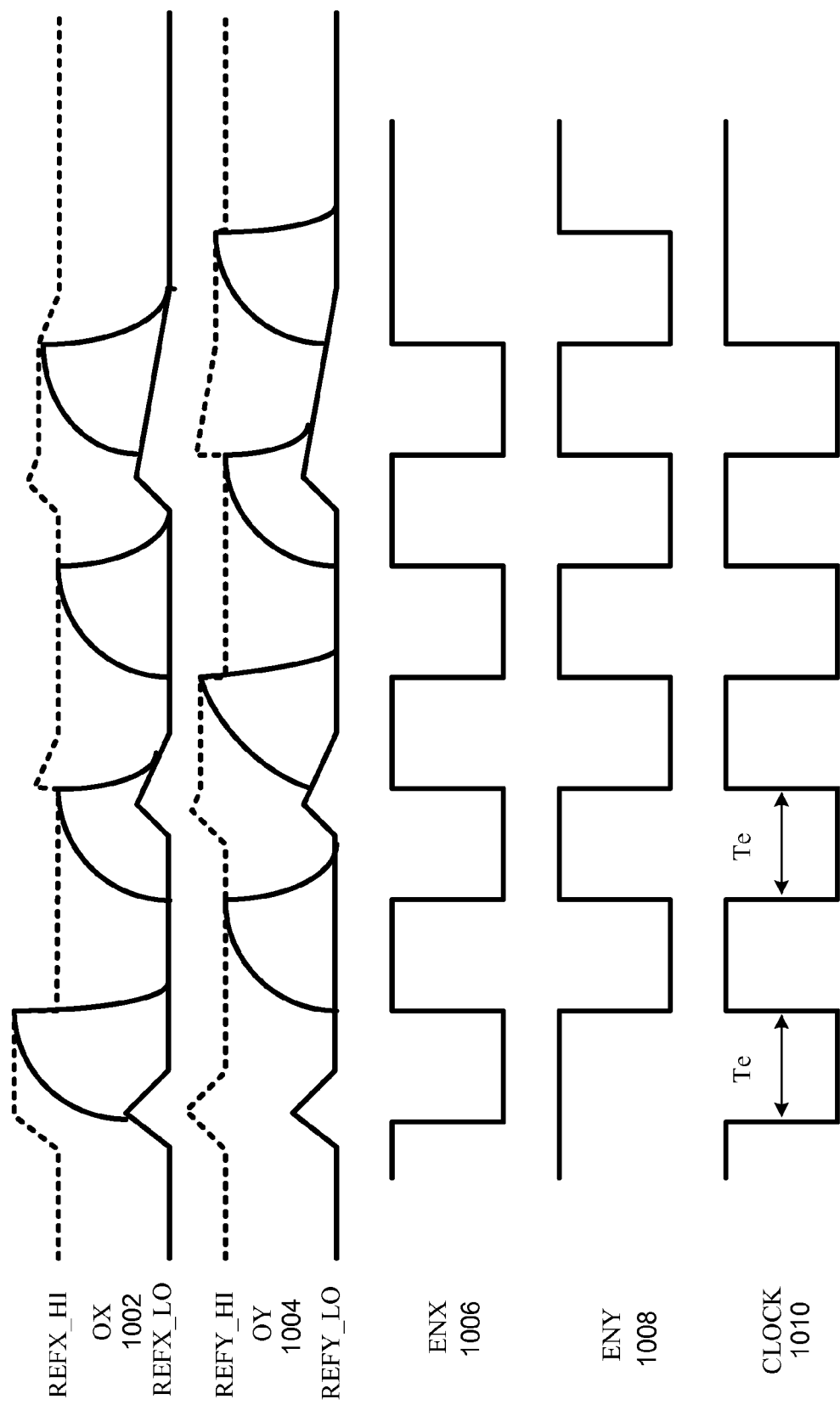

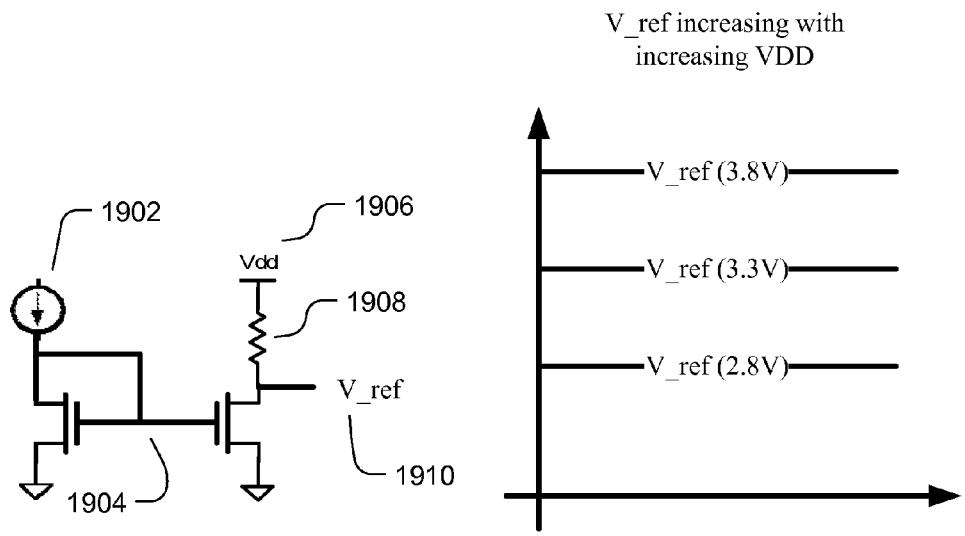
Fig. 19A  Fig. 19B
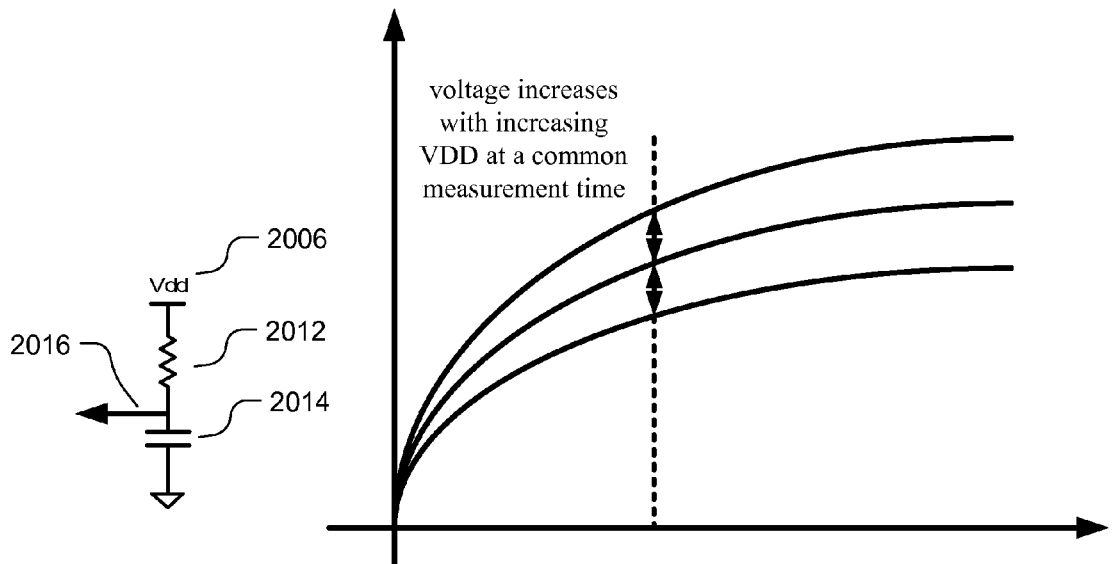
Fig. 20A  Fig. 20B

NOISE TOLERANT CLOCK CIRCUIT WITH REDUCED COMPLEXITY

RELATED APPLICATIONS

This application claims priority under 35 U.S.C. 119 to Taiwanese Application No. 099117296, filed 28 May 2010. This application is incorporated herein by reference.

BACKGROUND

1. Field of the Invention

The present technology relates to an integrated circuit with a clock circuit, tolerant to variations such as temperature, ground noise, and power noise.

2. Description of Related Art

The clock circuit of an integrated circuit operates with variations such as temperature, ground noise, and power noise. Because these variations affect the final timing of the output clock signal, various approaches address the variations in order to generate a uniform output clock signal despite the variations.

For example, U.S. Pat. No. 7,142,005 by Gaboury seeks to decouple power fluctuations from the clock signal, by adding buffer circuits with active loads, independent bias circuitry, and bias circuitry. These relatively complicated buffer circuits devote significantly more die area, and cost, to isolating such power fluctuations from the clock circuit.

In another example, the clock circuit of an integrated circuit relies on a reference signal generated by a combination of a voltage pump generating a high voltage in excess of a voltage supply, and a voltage regulator. Such circuitry consumes a great deal of layout area, and also consumes high current.

What is needed is an approach to address such variations with reduced complexity and cost.

SUMMARY

One aspect of the technology is a clock integrated circuit generating a clock signal. The clock integrated circuit includes a compensation circuit, timing circuitry, and comparison circuitry. The timing circuitry and the comparison circuitry determine timing of the clock signal.

The compensation circuit is powered by a supply voltage. The compensation circuit generates a compensated voltage reference, which is compensated for variation in the supply voltage. The timing circuitry has an output alternating between reference signals at a rate determined by a time constant. The comparison circuitry compares an output of the timing circuitry against the compensated voltage reference.

In several embodiments, the technology of generating the compensated voltage reference allows omission of other circuitry, to save area, power, and cost. In one embodiment, the supply voltage is unregulated, in that the technology of generating the compensated voltage reference allows the omission of voltage regulation circuitry, to generate the voltage reference for the comparison circuitry. In one embodiment, the supply voltage is unpumped, in that the technology of generating the compensated voltage reference allows the omission of voltage pump circuitry, to generate the voltage reference for the comparison circuitry.

In one embodiment, responsive to a first voltage change in the supply voltage, the compensated voltage reference has a second voltage change. The second voltage change has a lower magnitude than the first voltage change. This is an example of the compensated voltage reference being compensated for variation in the supply voltage.

In one embodiment, the compensated voltage reference is compensated for variation in the supply voltage and for variation in temperature.

In one embodiment, the compensation circuit includes a current source with an output current that varies with changes in the supply voltage. In one example, the current source has an output current that increases with a positive voltage change in the supply voltage. In another example, the current source has an output current that decreases with a positive voltage change in the supply voltage.

In another embodiment, the compensation circuit includes multiple current sources. For example, a first current source has an output current that varies with changes in the supply voltage, and a second current source has an output current that varies with changes in temperature.

In some embodiments, the clock integrated circuit further comprises a latch. The latch generates the clock signal of the clock integrated circuit. The latch includes cross-coupled gates, such that outputs of the cross-coupled gates in the latch are coupled to inputs of different cross-coupled gates in the latch. The latch has an input coupled to an output of the comparison circuitry.

Another aspect of the technology is a method of generating a clock signal from a clock integrated circuit.

A compensated voltage reference is generated. The compensated voltage reference is compensated for variation in a supply voltage. A timing circuitry output is alternated between reference signals at a rate determined by a time constant. An output of the timing circuitry is compared against the compensated voltage reference. The steps of alternating and comparing, determine timing of the clock signal.

Various embodiments are disclosed herein.

BRIEF DESCRIPTION OF THE DRAWINGS

FIG. 5A is circuit diagram of the circuit for the reference signal for the level detection circuitry including a current source with current output that decreases with increasing temperature, and an output that decreases with increasing temperature.

FIG. 5B is a circuit diagram of the circuit for the reference signal for the level detection circuitry including a current source with current output that increases with increasing temperature, with output that increases with increasing temperature.

FIG. 5C is a circuit diagram of the circuit for the reference signal for the level detection circuitry including a current source with current output that decreases with increasing temperature, with output that increases with increasing temperature.

FIG. 10 is a set of graphs of voltage versus time, showing how clock circuitry that is tolerant of ground noise, will generate clock timing that is fairly constant with time-varying ground noise, due to circuitry such as that in FIG. 8.

FIGS. 16A and 16B are circuit diagrams of an integrated clock circuit with tolerance to power noise, including transistors that share a common noise phase of power noise in the timing circuitry power, and power noise in the reference signal used in level detection of the timing circuitry output, similar to FIG. 11, and adding switch circuitry to selectively bypass the noise tolerant circuitry, such as during power on.

FIG. 19A is a circuit diagram of an exemplary power circuit generating a voltage reference for the clock circuitry, such as for comparison circuitry which precedes latch circuitry.

FIG. 19B is a graph of the voltage reference generated by the power circuit of FIG. 19A, showing the strong dependence of the voltage reference on the supply voltage VDD.

FIG. 20A is a circuit diagram of an exemplary timing circuit with a time constant, such as for determining clock timing of a clock circuit.

FIG. 20B is a graph of the timing circuit output generated by the timing circuit of FIG. 20A, showing a dependence of the voltage reference on the supply voltage VDD, where the dependence is weaker than for FIG. 19B.

DETAILED DESCRIPTION

Figure 1:
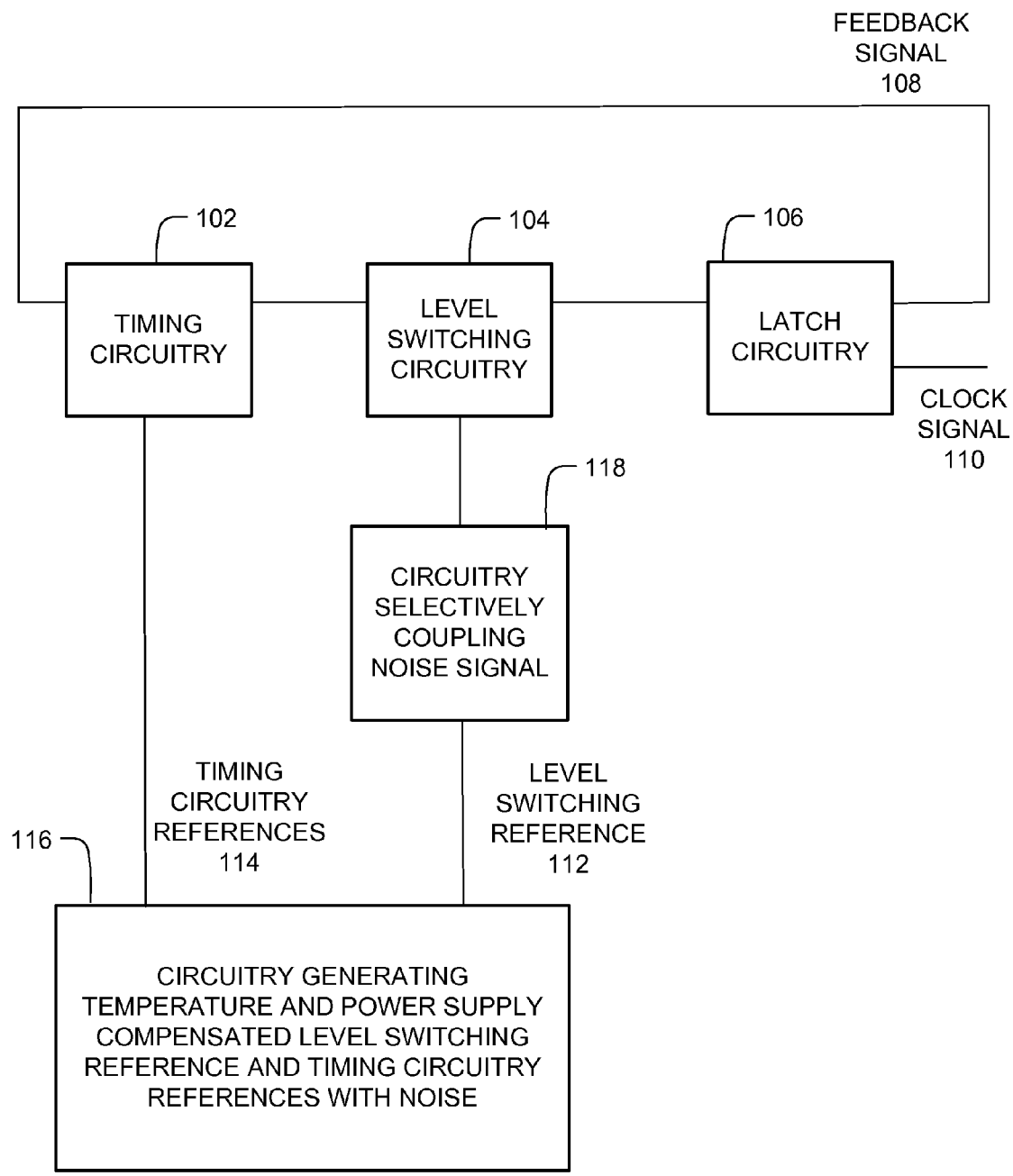
FIG. 1 is a block diagram of an integrated clock circuit with tolerance to variations such as temperature, ground voltage, and power voltage (variations from noise and variations in baseline).

FIG. 1 is a block diagram of an integrated clock circuit with tolerance to variations such as temperature, ground voltage, and power voltage.

The clock integrated circuit generally has a loop structure, with timing circuitry 102, level switching circuitry 104, and latch circuitry 106. The latch circuitry 106 generates a feedback signal from latch circuitry 106 back to timing circuitry 102, and the clock signal output 110. The timing circuitry 102 alternates between two reference signals according to a time constant. The time constant accordingly determines the timing of the clock integrated circuit. A typical example of the time constant is an exponential time constant that characterizes the rise and fall of an RC circuit or an RL circuit. The level switching circuitry monitors the output of the timing circuitry 102, and changes the output depending on whether the timing circuitry 102 is sufficiently high, or low. Examples of latch circuitry 106 are an SR latch, SR NAND latch, JK latch, gated SR latch, gated D latch, gated toggle latch. The latch circuitry 106 has two stable states and alternates between the two stable states to generate the clock signal output 110.

The two reference signals relied on by the timing circuitry 102 are generated by circuitry 116, which also generates the level switching reference relied on by the level switching circuitry 104. By commonly generating both the reference signals relied on by the timing circuitry 102, and the level switching reference relied on by the level switching circuitry 104, circuitry 116 minimizes the noise phase of a noise signal shared by the reference signals relied on by the timing circuitry 102, and the level switching reference relied on by the level switching circuitry 104. Because any noise phase is minimal, peaks and valleys in the noise signal that occur in the reference signals relied on by the timing circuitry 102, are synchronous with peaks and valleys in the noise signal that occur in the level switching reference relied on by the level switching circuitry 104. In addition to noise, the circuitry 116 also compensates for variations in the baseline value of the power supply.

The level switching reference 112 relied on by the level switching circuitry 104, is selectively coupled to the level switching circuitry 104 by circuitry 118. In some embodiments, this acts as a sample and hold of ground noise, so that the same ground noise is held by the timing circuitry 102, and by the level switching reference circuitry relied on by the level switching circuitry 104.

Although the shown block diagram addresses the variations in temperature, ground noise, and power noise, various embodiments of an improved clock integrated circuit address just one of these variations (e.g., just temperature, just power noise, or just ground noise), or just two of these variations (e.g., just temperature and power noise, just temperature and ground noise, or just power noise and ground noise).

Figure 2A:
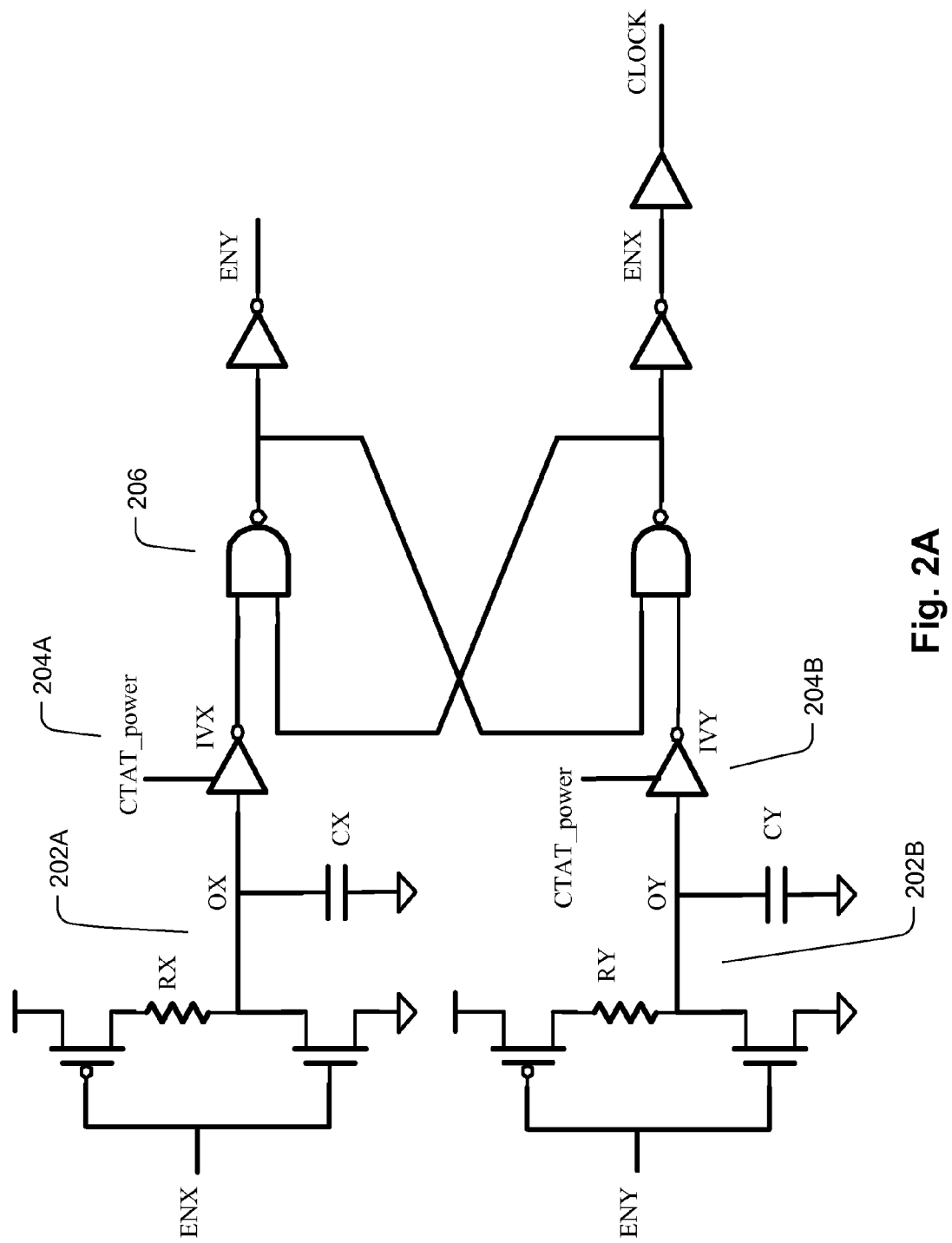
FIGS. 2A and 2B are circuit diagrams of an integrated clock circuit with tolerance to temperature variations, including inverter circuitry to evaluate the timing circuitry output, where FIG. 2A has capacitive timing circuitry coupled towards the ground, and FIG. 2B has capacitive timing circuitry coupled towards power.
Figure 2B:
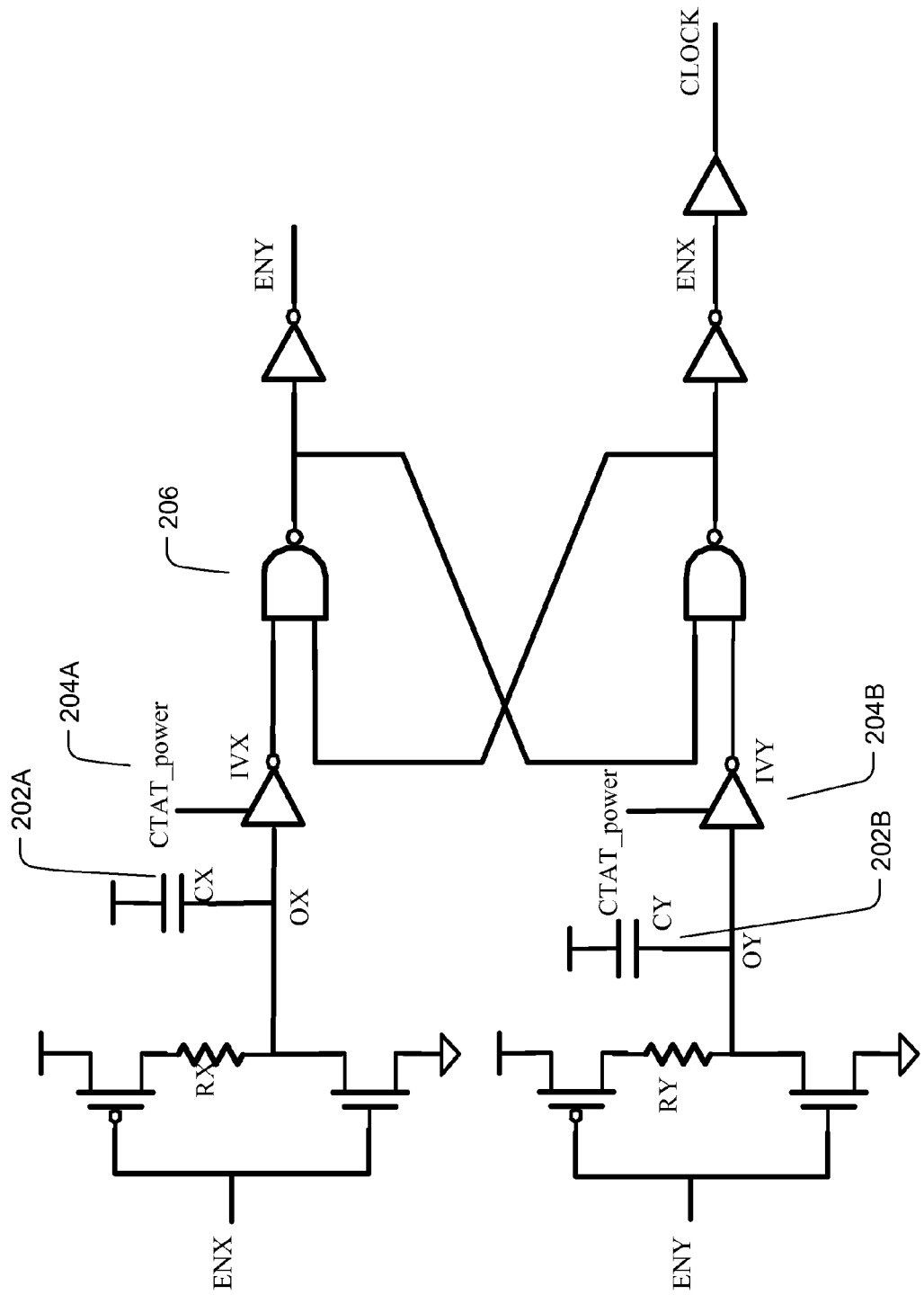

FIGS. 2A and 2B are circuit diagrams of an integrated clock circuit with tolerance to temperature variations, including inverter circuitry to evaluate the timing circuitry output.

Shown are parallel instances of timing circuitry 202A and 202B, parallel instances of inverter circuitry 204A and 204B, and the latch circuitry 206. The timing circuitry 202A and 202B is generally an inverter with resistance RX or RY, charging to or discharging from capacitance CX or CY, to change the output voltage at OX or OY.

FIG. 2A shows an embodiment where the capacitance CX or CY is coupled to a common ground. Although all possible variations are not explicitly shown in the Figures, the present technology covers all disclosed instances of the clock circuit showing the capacitance CX or CY, where the clock circuit is modified to couple the capacitance CX or CY to ground.

In one embodiment, the capacitance CX or CY is actually a PMOS transistor with the opposite terminal decoupled from a common ground with the inverters.

FIG. 2B shows an embodiment where the capacitance CX or CY is coupled to a common power. Although all possible variations are not explicitly shown in the Figures, the present technology covers all disclosed instances of the clock circuit showing the capacitance CX or CY, where the clock circuit is modified to couple the capacitance CX or CY to a common power.

In one embodiment, the capacitance CX or CY is actually a PMOS transistor with the opposite terminal decoupled from a common power with the inverters.

The inverter circuitry 204A and 204B is driven by a source of CTAT_power, or power that is conversely proportional to temperature, to decrease with increasing temperature.

The inverters are very different from the op amp version. In the op amp version, a Vref is compared against the timing circuit output (e.g., RC circuit rise/fall). But in the inverter version, the power of the inverter is controlled, to change the trip point of the inverter and thereby detect the timing circuit output (e.g., RC circuit rise/fall). In the inverter version, an additional temperature relationship between the power and the trip point of the inverter is of concern.

The inverters are advantageous over the op amp version, for one or more of the following reasons: (1) lower working VDD; (2) smaller circuit size (inverter has only 2 MOSFETs, but the op amp has 5 or more MOSFETs). (3) simpler design; (4) lower active current (inverter has one current path, but the op amp has 2 or 3 current paths and includes an extra current mirror; and (5) higher speed (inverter has one stage delay, the op amp has 2 or 3 stages of delay).

The latch circuitry 206 is cross-coupled, such that the output of one gate is coupled to the inputs of the other gate. One input of a gate is directly coupled to the output of another gate. Another input of a gate is directly coupled to the output of another gate through the timing circuitry and the level detection circuitry.

Figure 2C:
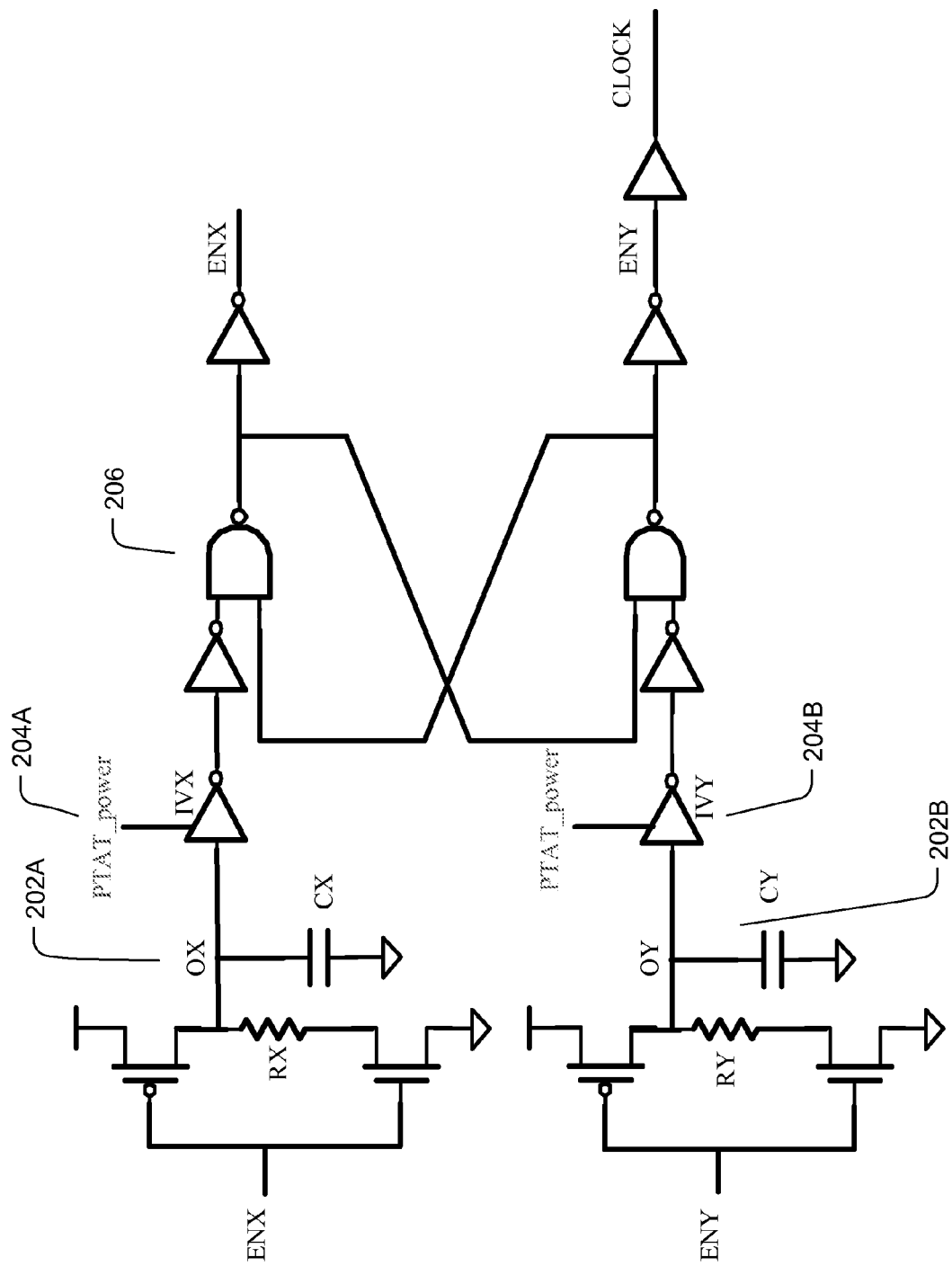
FIG. 2C is a circuit diagram of an integrated clock circuit with tolerance to temperature variations, similar to FIG. 2A, but receiving power from PTAT power sources rather than CTAT power sources.

FIG. 2C shows another embodiment of a clock circuit. Although otherwise similar to FIG. 2A, in FIG. 2C the parallel instances of inverter circuitry 204A and 204B are driven by sources of PTAT_power, or power that is proportional to temperature, to increase with increasing temperature. Although all possible variations are not explicitly shown in the Figures, the present paper covers instances of the clock circuit showing a source of CTAT_power, where the source of CTAT_power is replaced with a source of PTAT_power.

Similarly, although all possible variations are not explicitly shown in the Figures, the present paper covers all disclosed instances of the clock circuit showing a source of PTAT_power, where the source of PTAT_power is replaced with a source of CTAT_power.

Figure 2D:
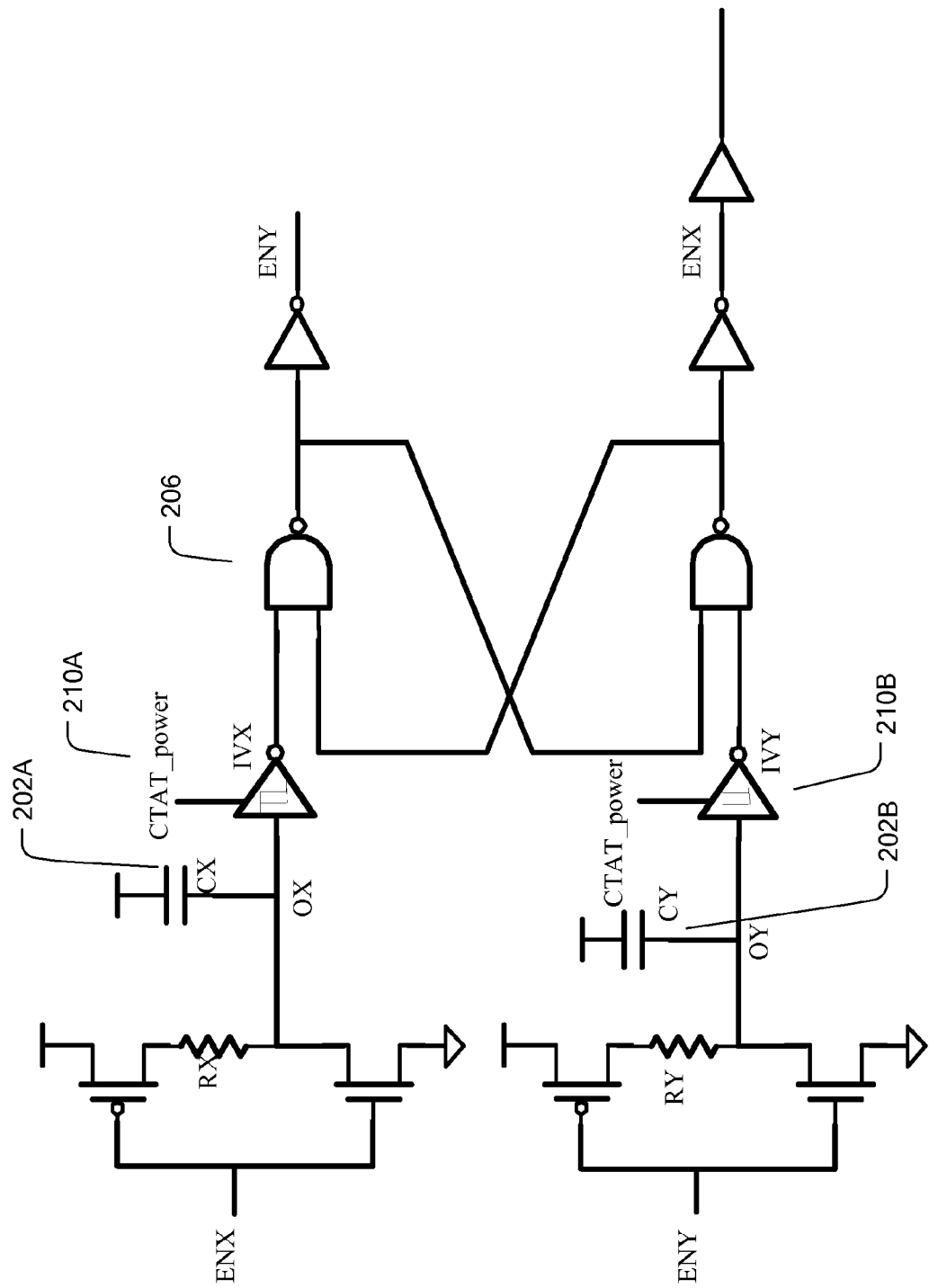
FIG. 2D is a circuit diagram of an integrated clock circuit with tolerance to temperature variations, including Schmitt trigger circuitry to perform level detection of the timing circuitry output.

FIG. 2D is a diagram of an integrated clock circuit with tolerance to temperature variations, including Schmitt trigger circuitry to evaluate the timing circuitry output.

Although similar to FIG. 2B, in FIG. 2D the level switching circuitry 210A and 210B are instances of a Schmitt trigger driven by a source of CTAT_power, and include op amps with closed loop positive feedback through resistance.

Figure 2E:
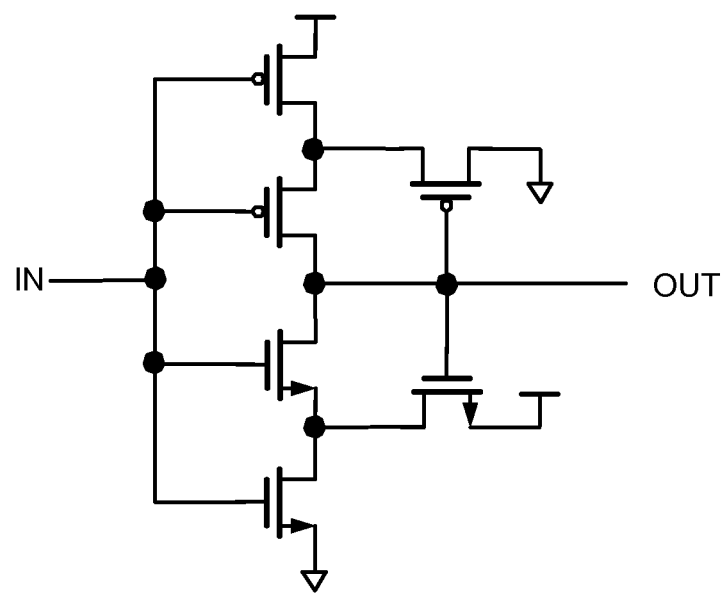
FIG. 2E is a circuit diagram of a Schmitt trigger, such as in FIG. 2D.

FIG. 2E is a diagram of a Schmitt trigger circuit.

Figure 3A:
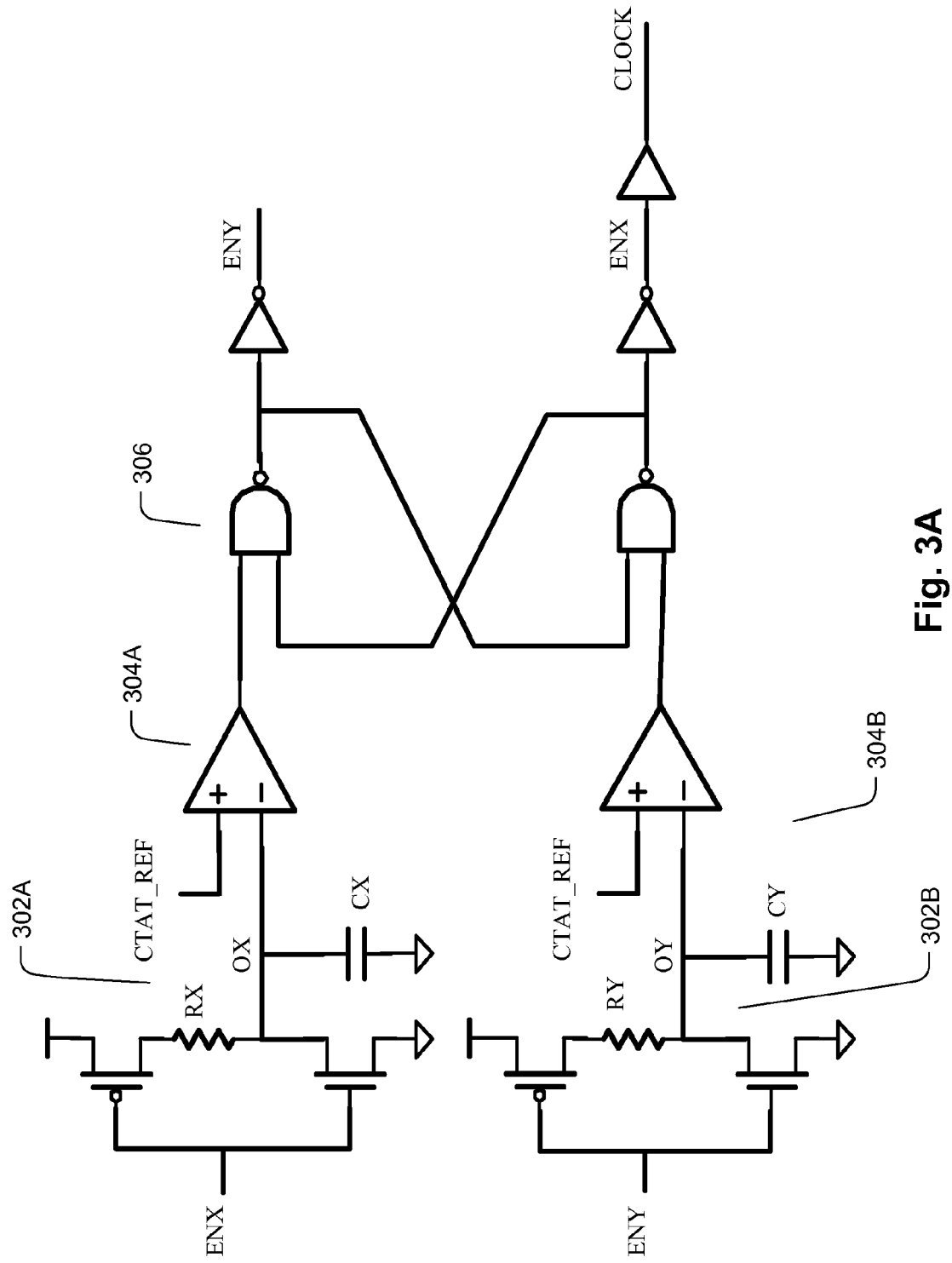
FIGS. 3A and 3B are circuit diagrams of an integrated clock circuit with tolerance to temperature variations, including op amp circuitry to perform level detection of the timing circuitry output, where FIG. 3A has capacitive timing circuitry coupled towards the ground, and FIG. 3B has capacitive timing circuitry coupled towards power.
Figure 3B:
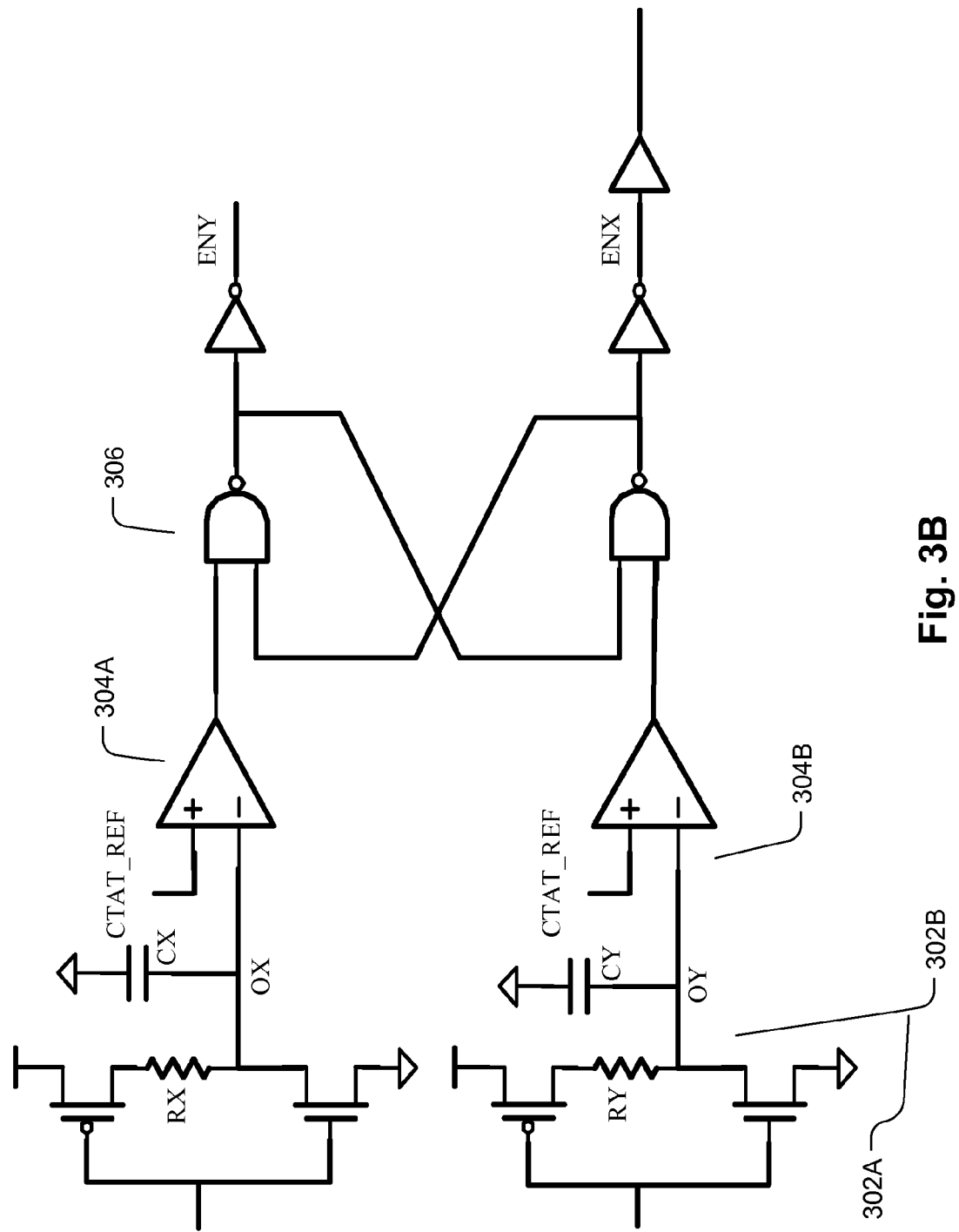

FIG. 3 is a circuit diagram of an integrated clock circuit with tolerance to temperature variations, including OP amp circuitry to perform level detection of the timing circuitry output by comparison with a reference.

Shown are parallel instances of timing circuitry 302A and 302B, parallel instances of level switching circuitry 304A and 304B, and the latch circuitry 306. The level switching circuitry 304A and 304B are OP amp comparator with a reference voltage CTAT_REF. Otherwise, the clock circuit is generally similar to FIG. 2A.

Figure 4A:
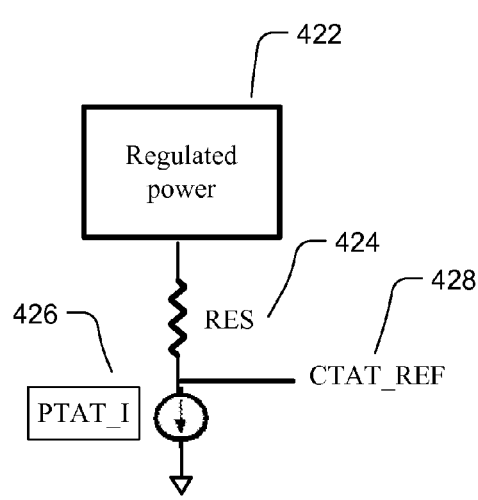
FIG. 4A is a circuit diagram of the circuit for the reference signal for the level detection circuitry including a PTAT current source, with output that decreases with increasing temperature

FIG. 4A is circuit diagram of the reference signal for the level detection circuitry, including a current source with current output that increases with increasing temperature.

FIG. 4A shows how the CTAT_power signal relied on by the level detection circuitry is generated, shown here as CTAT_REF 428. A constant current source PTAT_I 426, draws current that is proportional to temperature, to increase with increasing temperature, from regulated power 422 through resistor RES 424. The regulated power 422 supplies a constant voltage independent of varying temperature. The regulated power supplies a constant power and does not change with the VDD and temperature. An example is the output of a regulator with a bandgap reference. The resulting output is conversely proportional to temperature, due to the increasing voltage drop across the resistor with increasing temperature and the placement of the output terminal on the lower side of this voltage drop. An example of the current source is shown in FIG. 4E.

Figure 4B:
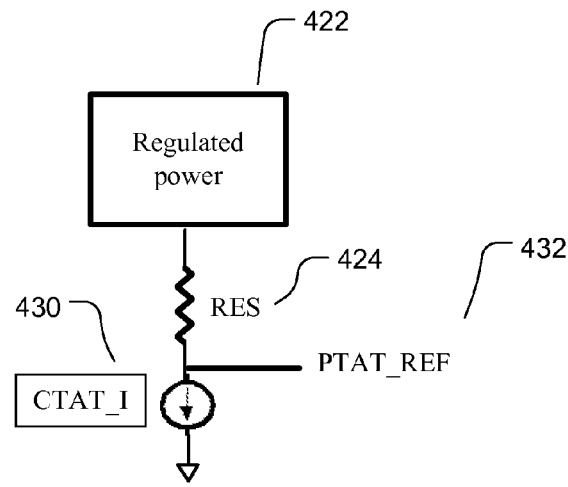
FIG. 4B is a circuit diagram of the circuit for the reference signal for the level detection circuitry including a CTAT current source, with output that increases with increasing temperature.

FIG. 4B is a variation of the circuit of FIG. 4A, where the constant current source PTAT_I 426 is replaced with the constant current source CTAT_I 430, and the CTAT_power signal CTAT_REF 428 relied on by the level detection circuitry is replaced with PTAT_power signal PTAT_REF 432 relied on by the level detection circuitry. An example of: the current source is shown in FIG. 4G.

Figure 4C:
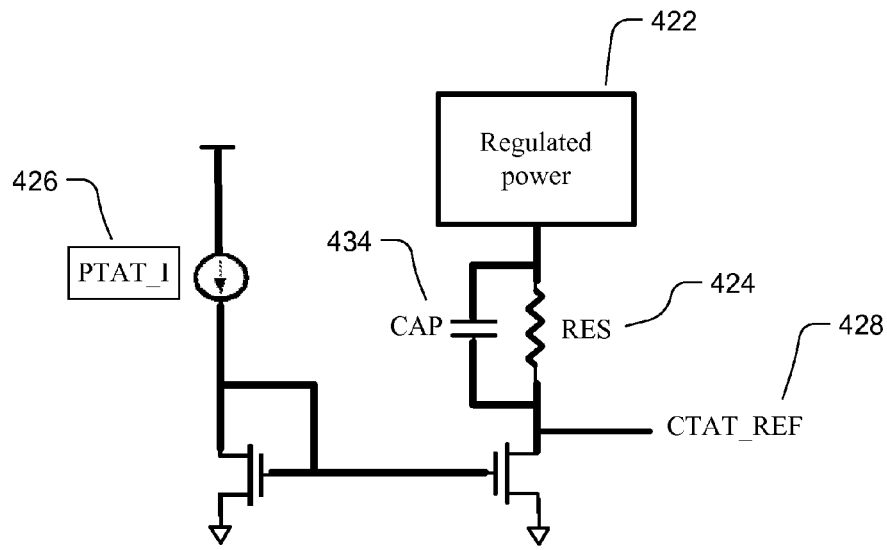
FIG. 4C is a circuit diagram of the circuit for the reference signal for the level detection circuitry including a current source, with output that increases with increasing temperature, and further including a capacitor in parallel with a load resistor of a current mirror.

FIG. 4C is a variation of the circuit of FIG. 4A, with a bypass capacitor 434 in parallel with resistor RES 424, which decreases the noise. Also, the current source includes a current mirror. An example of the current source circuit is shown in FIG. 4D.

Figure 4D:
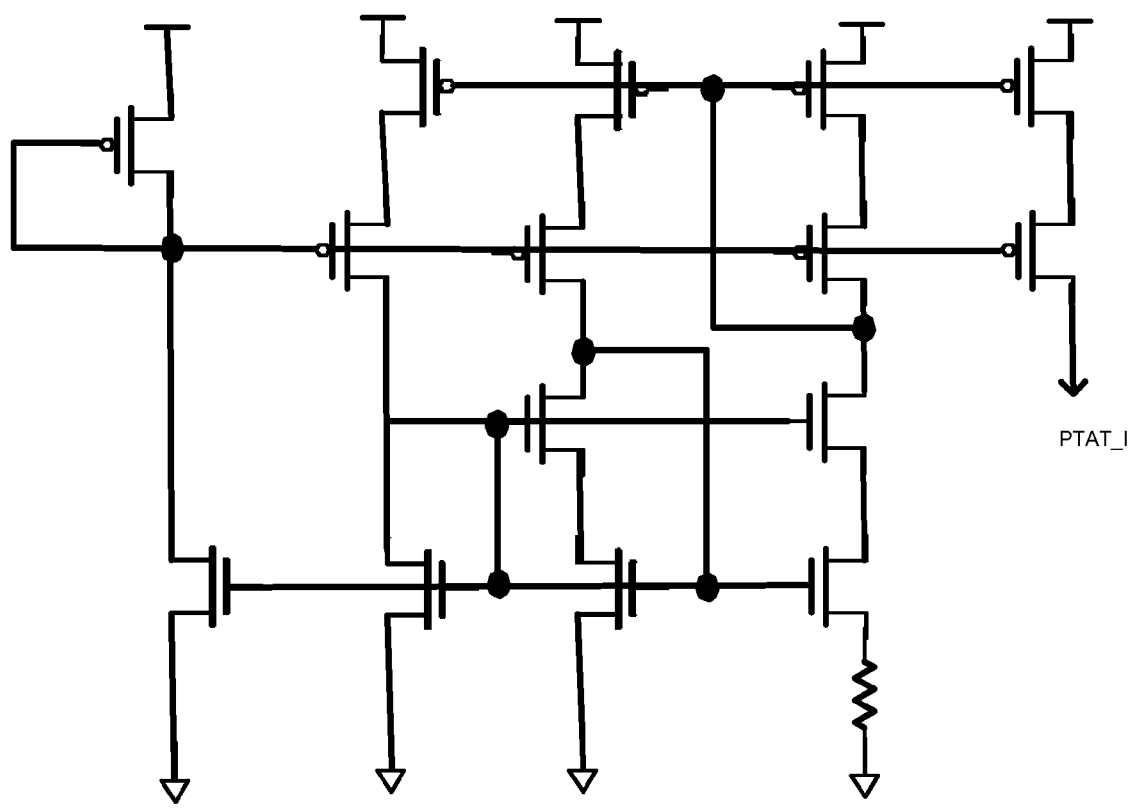
FIG. 4D is a current generator based reference circuit providing PTAT current from PMOS devices.
Figure 4E:
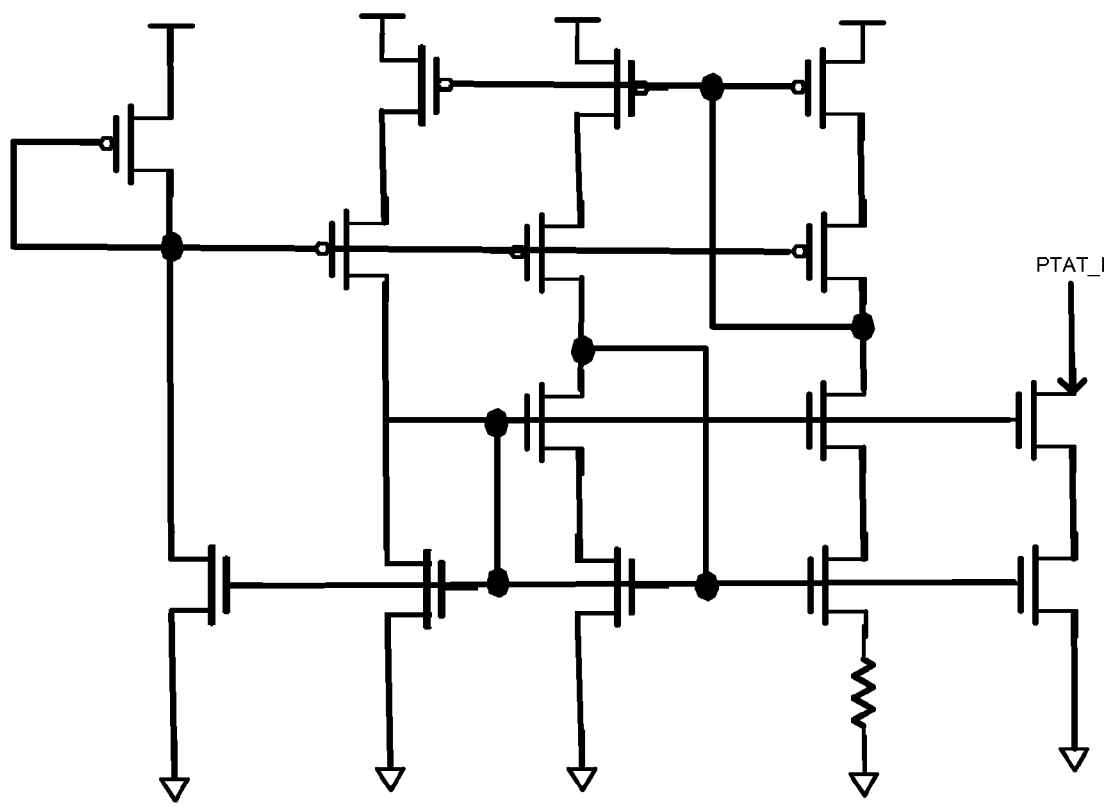
FIG. 4E is a current generator based reference circuit providing PTAT current from NMOS devices.

FIG. 4D is a current generator based reference circuit providing PTAT current from PMOS devices.

FIG. 4E is a current generator based reference circuit providing PTAT current from NMOS devices.

In FIGS. 4D and 4E, the circuit uses the delta_Vgs between two MOS transistors having the same current, proportional to temperature. So delta_Vgs/resistance=PTAT_I. In FIGS. 4D and 4E, these two transistors are identified with circles.

Figure 4F:
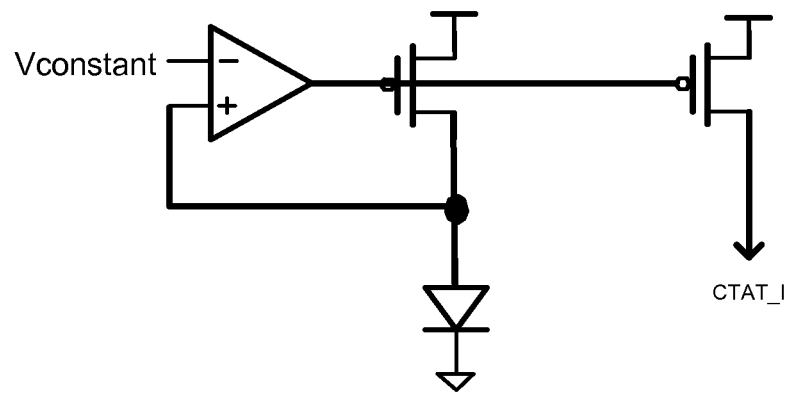
FIG. 4F is a current generator based reference circuit providing CTAT current from PMOS devices.
Figure 4G:
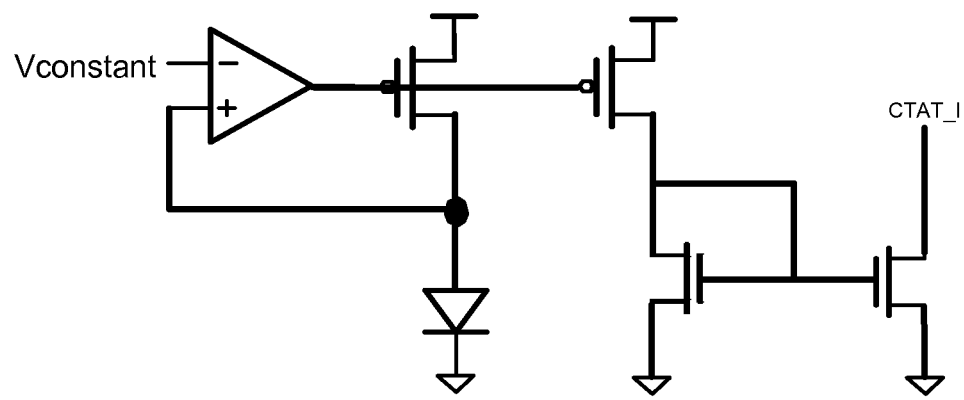
FIG. 4G is a current generator based reference circuit providing CTAT current from NMOS devices.

FIG. 4F is a current generator based reference circuit providing CTAT current from PMOS devices.

FIG. 4G is a current generator based reference circuit providing CTAT current from NMOS devices.

A current generator based reference circuit as described herein is advantageous, because in several embodiments, a single kind of temperature dependent parameter is controlled, instead of two kinds of temperature dependent parameters associated with different materials having different temperature dependence.

FIG. 5A is circuit diagram of the reference signal for the level detection circuitry, including a current source with current output that decreases with increasing temperature.

FIG. 5A shows how the CTAT_power signal relied on by the level detection circuitry is generated, shown here as CTAT_REF 528. A constant current source CTAT_I 526, draws current that is conversely proportional to temperature, to decrease with increasing temperature, from regulated power 522 through resistor RES 524. The resulting output is conversely proportional to temperature, due to the decreasing voltage drop across the resistor with increasing temperature and the placement of the output terminal on the upper side of this voltage drop.

An example of the shown current sources is a cascade current source.

FIGS. 5B, 5C, 5D, and 5E are other examples to generate the reference voltage signal.

FIG. 5B is a variation of the circuit of FIG. 5A, where the constant current source CTAT_I 526 is replaced with the constant current source PTAT_I 530, and the CTAT_power signal CTAT_REF 528 relied on by the level detection circuitry is replaced with PTAT_power signal PTAT_REF 532 relied on by the level detection circuitry.

FIG. 5C is a variation of the circuit of FIG. 5A, where the resistor RES 524 is replaced with the diode DI0 530. An example of the current source is shown in FIG. 4F.

Figure 5D:
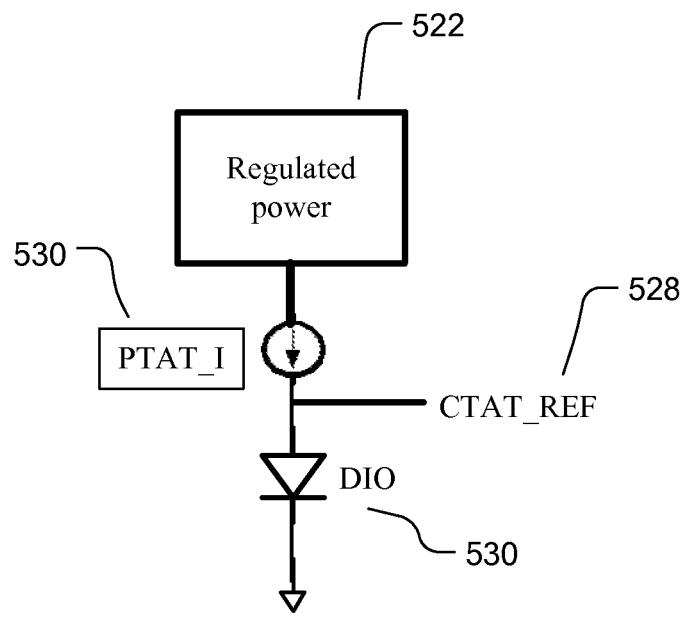
FIG. 5D is a circuit diagram of the reference signal for the level detection circuitry as in FIG. 5C, but including a current source with current output that increases with increasing temperature.

FIG. 5D is a variation of the circuit of FIG. 5C, where the constant current source CTAT_I 526 is replaced with the constant current source PTAT_I 530, and the placement of the output terminal is moved from the upper side of the voltage drop across the constant current source, to the lower side of the voltage drop across the constant current source.

Figure 5E:
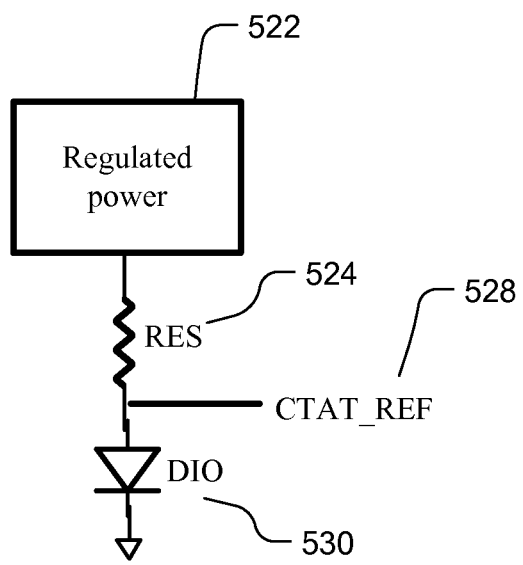
FIG. 5E is a variation of the circuit of FIG. 5C, where the constant current source replaced with the resistor.

FIG. 5E is a variation of the circuit of FIG. 5C, where the constant current source CTAT_I 526 is replaced with the resistor RES 524.

Figure 6A:
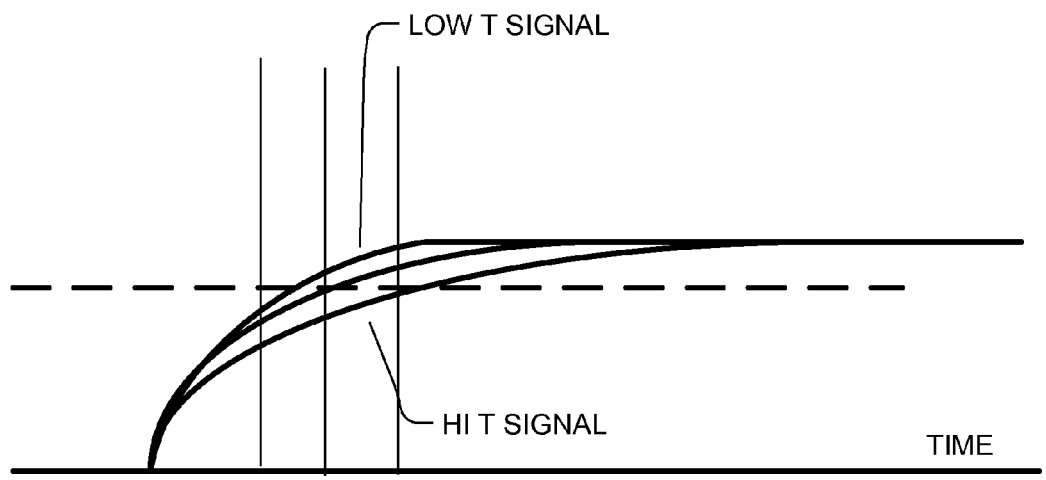
FIG. 6A is a set of graphs of time versus rising magnitude traces showing how clock circuitry that is intolerant of temperature variation generates clock timing that varies widely with varying temperature.

FIG. 6A is a set of graphs of time versus magnitude traces showing how clock circuitry that is intolerant of temperature variation generates clock timing that varies widely with varying temperature.

FIG. 6A shows a range of traces at high temperature, low temperature, and intermediate temperature. The lower the temperature, the faster the timing circuitry becomes, and the higher the temperature, the slower the timing circuitry becomes. Due to the common timing circuitry reference, the timing circuitry reaches the reference more quickly at low temperature than at high temperature. Consequently, the timing of the clock circuitry is faster at low temperature than at high temperature.

Figure 6B:
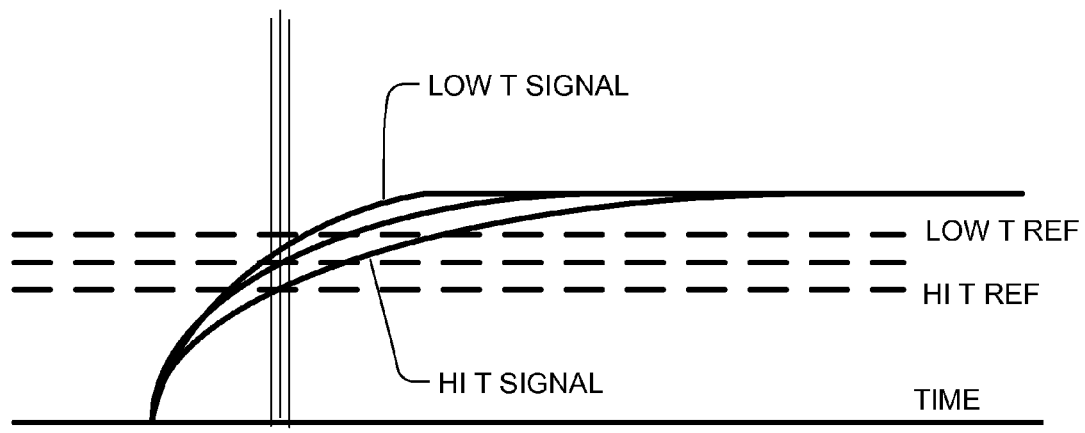
FIG. 6B is a set of graphs of time versus rising magnitude traces showing how clock circuitry that is tolerant of temperature variation generates clock timing is fairly constant with varying temperature, due to circuitry such as that in FIGS. 2-5.

FIG. 6B is a set of graphs of time versus magnitude traces showing how clock circuitry that is tolerant of temperature variation generates clock timing is fairly constant with varying temperature, due to circuitry such as that in FIGS. 2-5.

FIG. 6B shows a range of traces at high temperature, low temperature, and intermediate temperature. As in FIG. 6A, the lower the temperature, the faster the timing circuitry becomes, and the higher the temperature, the slower the timing circuitry becomes. However, different timing circuitry references are used in FIG. 6B, in contrast with the common timing circuitry reference used in FIG. 6A. Although timing circuitry reaches the reference more quickly at low temperature than at high temperature, the timing circuitry reference is also correspondingly higher. Consequently, the timing of the clock circuitry shows little variation despite the temperature variation and resulting speed variation in the timing circuitry.

Figure 7A:
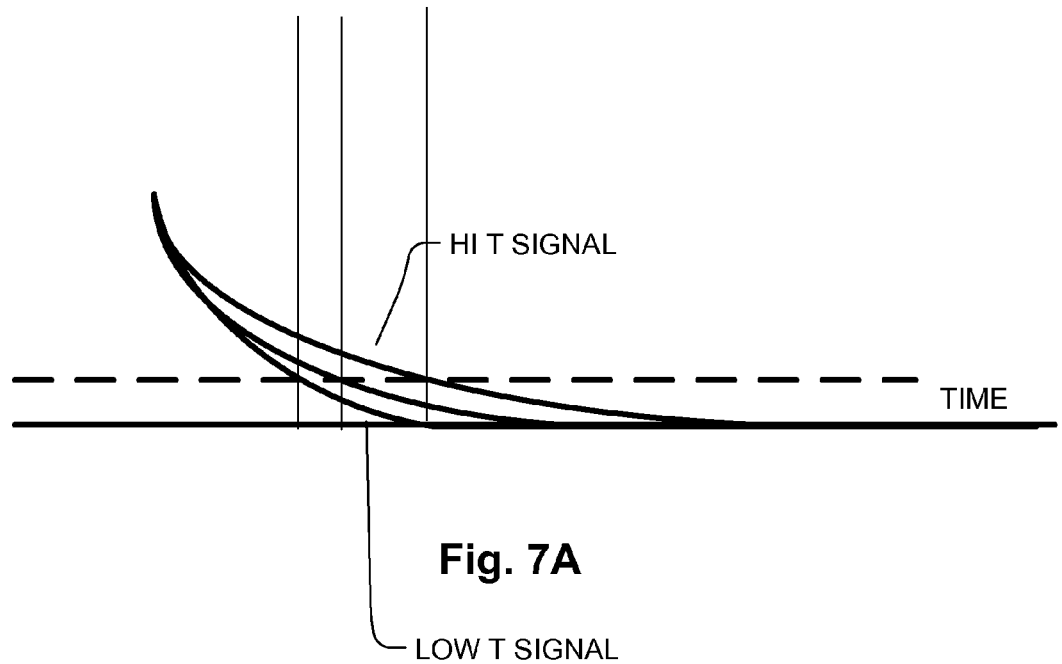
FIG. 7A is a set of graphs of time versus falling magnitude traces showing how clock circuitry that is intolerant of temperature variation generates clock timing that varies widely with varying temperature.
Figure 7B:
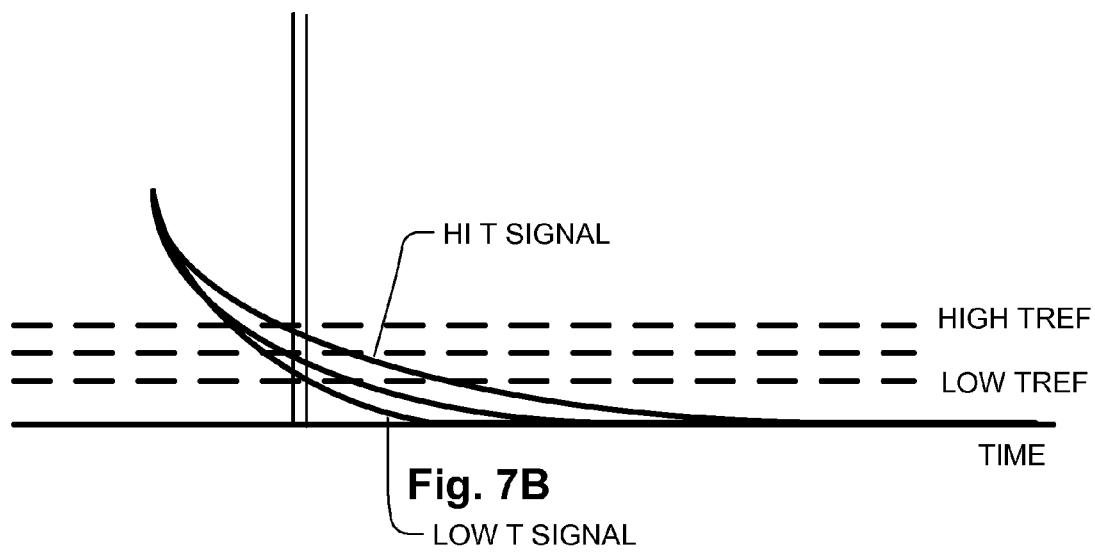
FIG. 7B is a set of graphs of time versus falling magnitude traces showing how clock circuitry that is tolerant of temperature variation generates clock timing is fairly constant with varying temperature, due to circuitry such as that in FIGS. 2-5.

FIGS. 7A and 7B are other embodiments, which show falling signals rather the rising signals of FIGS. 6A and 6B, but still show the same time constants.

Whether a clock signal relies on rising signals such as FIGS. 6A and 6B, or falling signals such as FIGS. 7A and 7B, depends on whether the capacitance CX and CY is coupled towards ground as in FIG. 2A or towards power as in FIG. 2B.

Figure 8A:
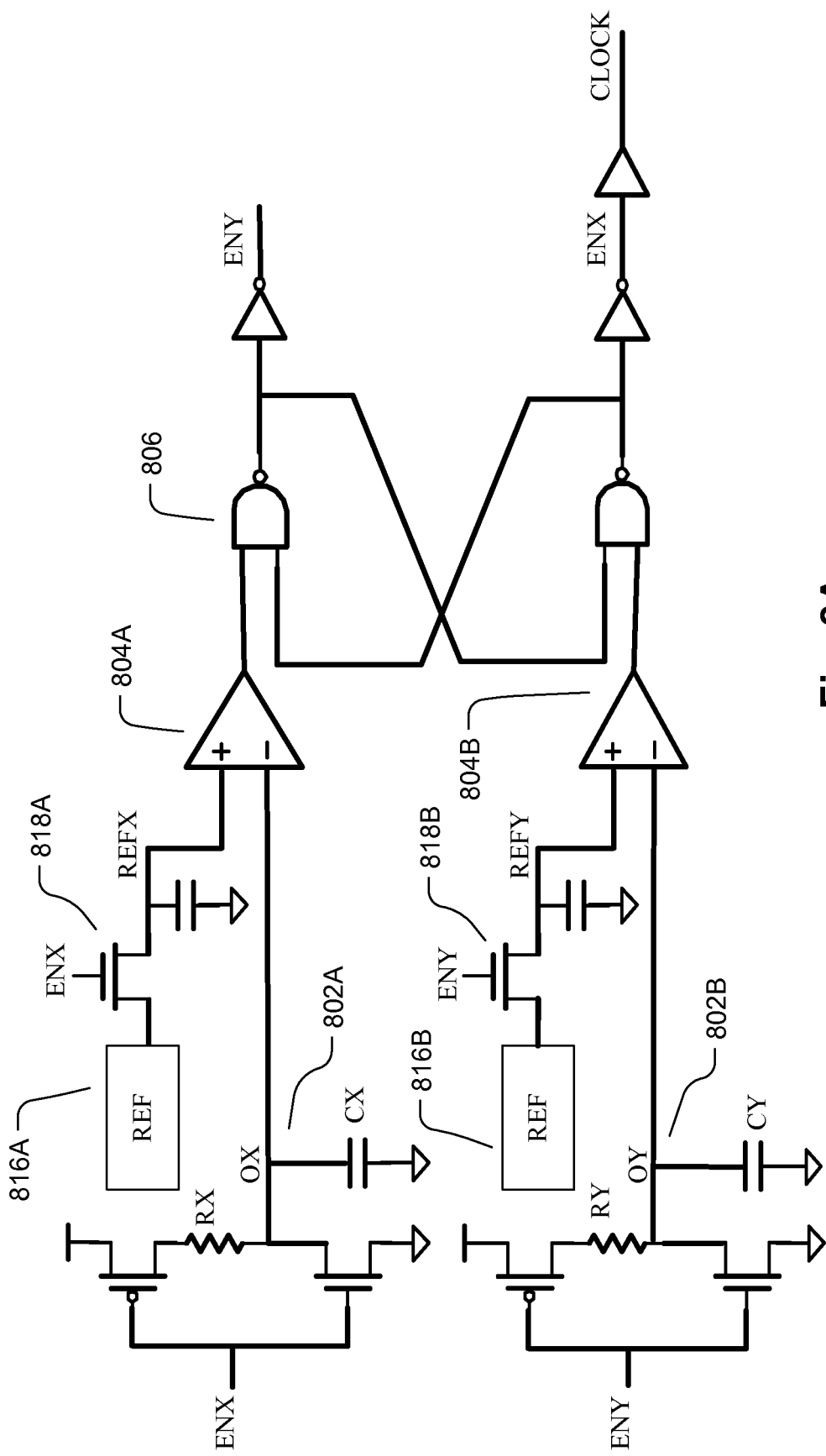
FIGS. 8A and 8B are circuit diagrams of an integrated clock circuit with tolerance to ground noise, including transistors that selectively couple the ground noise as part of the reference signal used in level detection of the timing circuitry output, where in FIG. 8A the switching reference circuitry include capacitance circuitry coupled towards ground, and in FIG. 8B the switching reference circuitry includes capacitance circuitry coupled towards power.
Figure 8B:
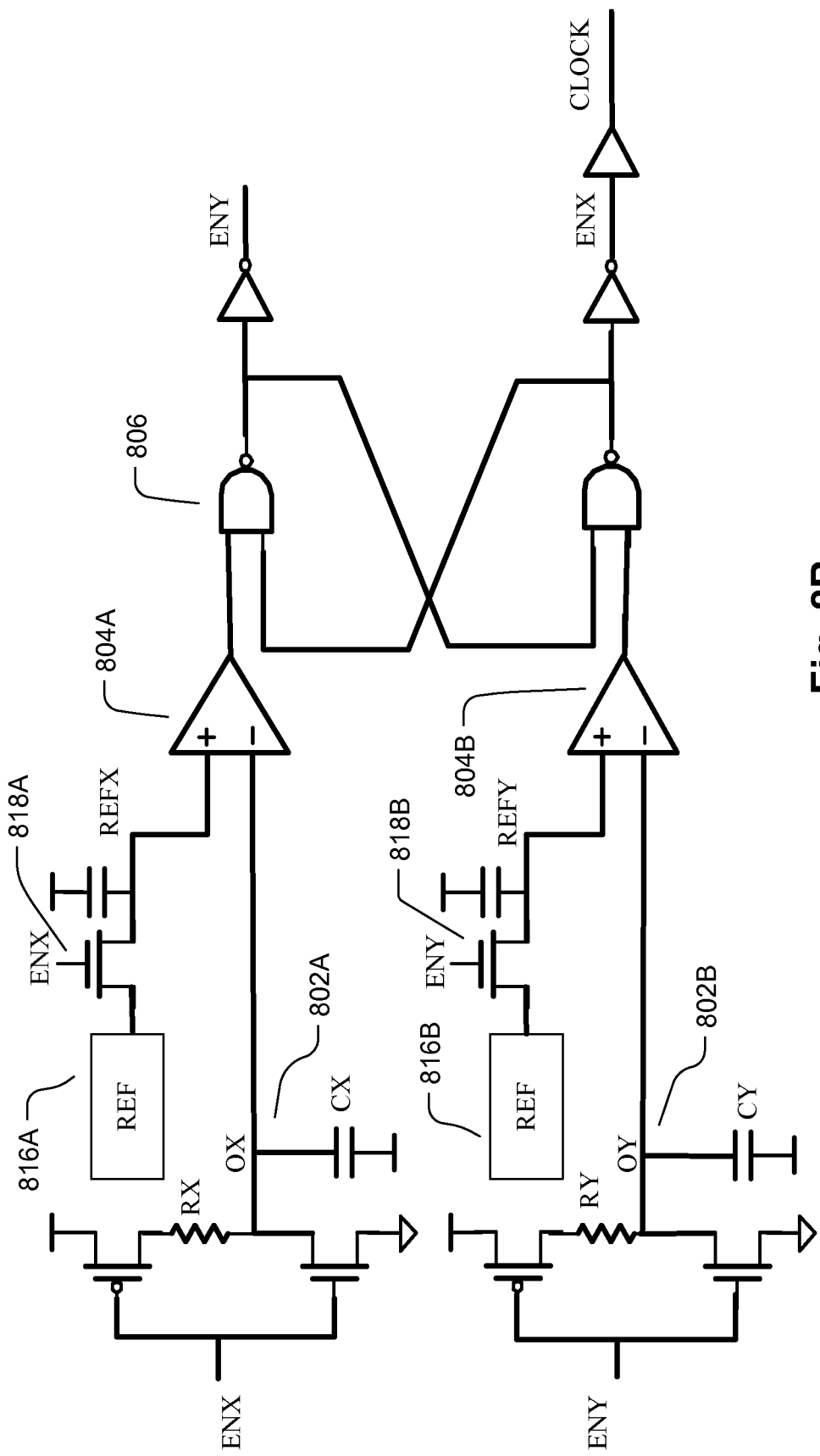

FIGS. 8A and 8B are circuit diagrams of an integrated clock circuit with tolerance to ground noise, including transistors that selectively couple the ground noise as part of the reference signal used in level detection of the timing circuitry output.

Shown are parallel instances of timing circuitry 802A and 802B, parallel instances of level switching circuitry 804A and 804B, and the latch circuitry 806. The level switching circuitry 804A and 804B selectively couples the ground noise coming from the level switching reference circuitry 816A or 816B, and is stored in the capacitive node REF X or REFY, respectively subject to the switching action of the switching transistor 818A turned on by signal ENX and the switching transistor 818B turned on by signal ENY. This acts as a sample and hold of ground noise, so that the same ground noise is held by the timing circuitry 802A or 802B, and by the level switching reference circuitry reference nodes REFX or REFY, relied on by the level switching circuitry 104.

In one embodiment, the capacitance CX or CY is actually a PMOS transistor with the opposite terminal decoupled from a common power with the PMOS which connects to the RX or RY OX is kept at ground when ENX is high. Then ENX goes low and turns off the NMOS; at this moment the ground noise is held in the OX. If the noise is high then the pre-charge speed is fast; if the noise is low then the pre-charge speed is slow. This circuit lets the REFX or REFY hold the same ground noise at the same time.

In FIG. 8A the switching reference circuitry reference nodes REFX or REFY, includes capacitance circuitry coupled towards ground. In FIG. 8B the switching reference circuitry reference nodes REFX or REFY, includes capacitance circuitry coupled towards power.

In various embodiments, the level switching reference circuitry 816A or 816B are two sets of circuitry, or the same set of circuitry shared by the multiple parallel instances of timing circuitry and the multiple level switching circuitry 804A and 804B.

Figure 9:
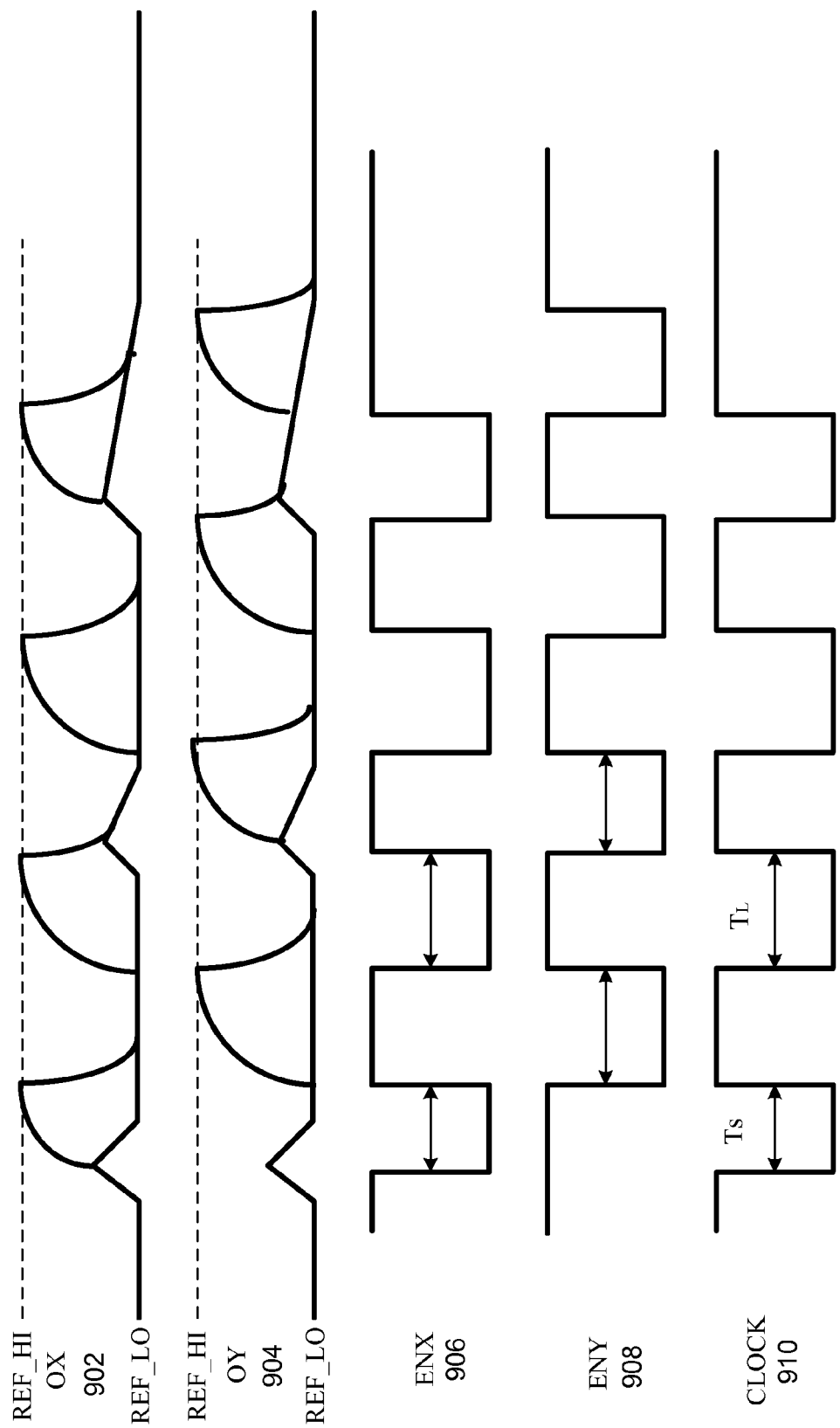
FIG. 9 is a set of graphs of voltage versus time, showing how clock circuitry that is intolerant of ground noise, will generate clock timing that varies widely with time-varying ground noise.

FIG. 9 is a set of graphs of voltage versus time, showing how clock circuitry that is intolerant of ground noise, will generate clock timing that varies widely with time-varying ground noise.

FIG. 9 shows how traces OX and OY are affected by ground noise, in this case the REF_LO signal. When there is a peak in ground noise, then the process of the timing circuit charging from REF_LO to REF_HI gets a head start, resulting in less time being required for the timing circuit to charge from REF_LO to REF_HI. Accordingly, the resulting clock signal output 910 has a wide variation in clock period.

When ENX goes high, the OX is kept at ground and the voltage varies with the ground noise. When ENX goes low, and turns off the NMOS, then the ground noise is kept at the OX. But the reference level still varies with the ground noise without more. The worse case is that OX holds a high ground noise and during the charging period the reference circuit suffer a negative ground level; then the reference is much lower than expected. So a sample and hold like structure keeps the same ground noise in the REFX or REFY.

FIG. 10 is a set of graphs of voltage versus time, showing how clock circuitry that is tolerant of ground noise, will generate clock timing that is fairly constant with time-varying ground noise, due to circuitry such as that in FIG. 8.

FIG. 10 shows how traces OX and OY are affected by ground noise, in this case the REF_LO signal. When there is a peak or other variation in ground noise, this peak or other variation is stored in the respective capacitor for REFX or REFY of FIG. 8. Because ground noise affecting REF_LO is tracked by this sample-and-hold reference circuitry, the level detection circuitry compares the same ground noise from the level detection reference circuitry, and the timing circuitry. After the ground noise is sampled and held in this manner, the ground noise, which continued to change, is decoupled from the sampling circuitry. Accordingly, in the process of the timing circuit charging from REF_LO to REF_HI, there is no "head start", and the same time is required for the timing circuit to charge from REF_LO to REF_HI, despite the ground noise. Accordingly, the resulting clock signal output 910 has a common clock period during a wide variation in ground noise.

Another embodiment is directed to sampling the ground noise and then decoupling the ground noise from the sampling circuitry during discharging, rather than decoupling the ground noise from the sampling circuitry during charging as in FIGS. 9 and 10. This embodiment carries the additional difficulty of having to address power noise from the noise regulator power.

In another embodiment (like FIG. 2C), the sample and hold circuit will hold the power noise instead of the ground noise.

Figure 11A:
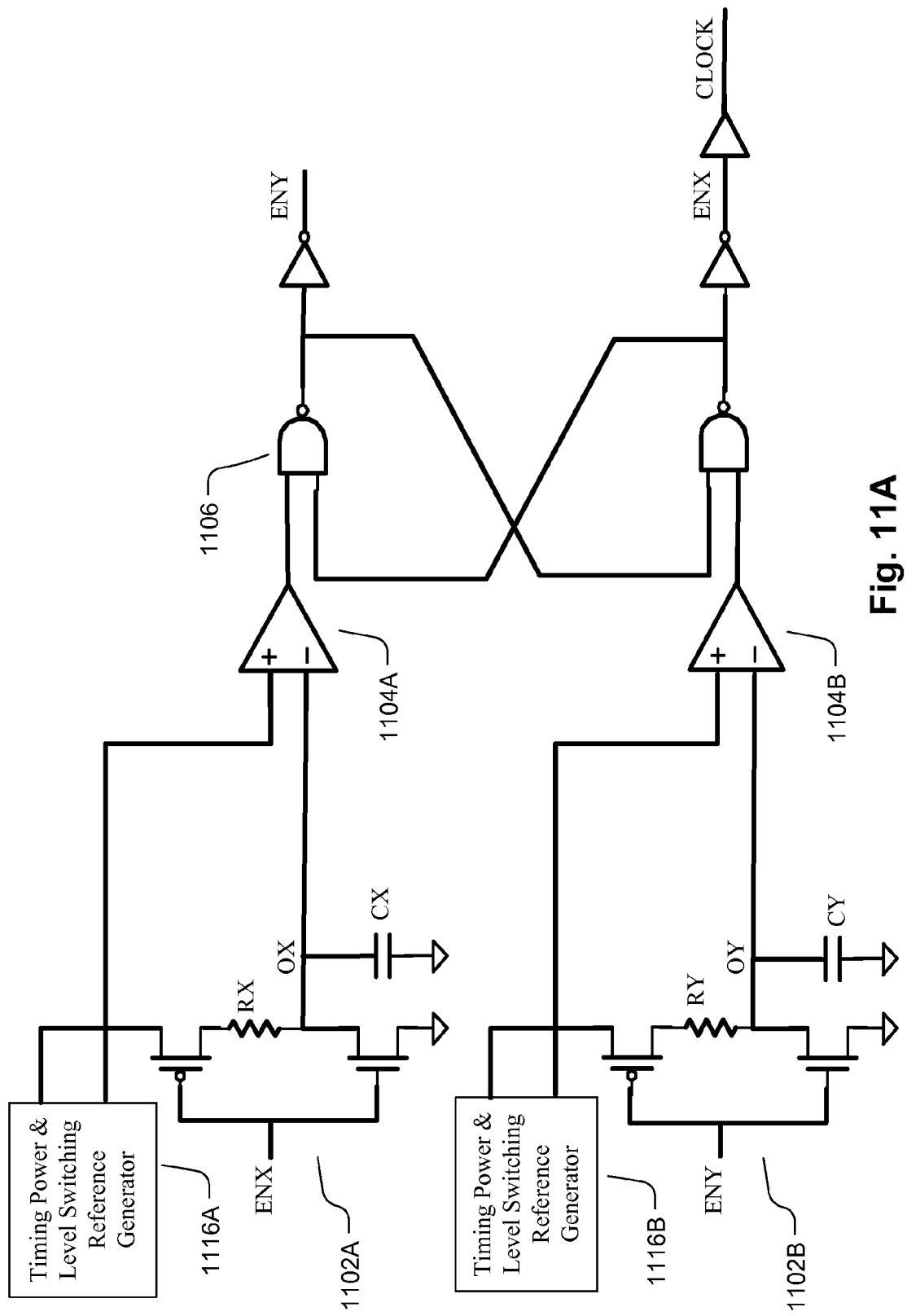
FIGS. 11A and 11B are circuit diagrams of an integrated clock circuit with tolerance to power noise, including transistors that share a common noise phase of power noise in the timing circuitry power, and power noise in the reference signal used in level detection of the timing circuitry output, where in FIG. 11A the capacitance circuitry is coupled towards ground, and in FIG. 11B the capacitance circuitry is coupled towards power.
Figure 11B:
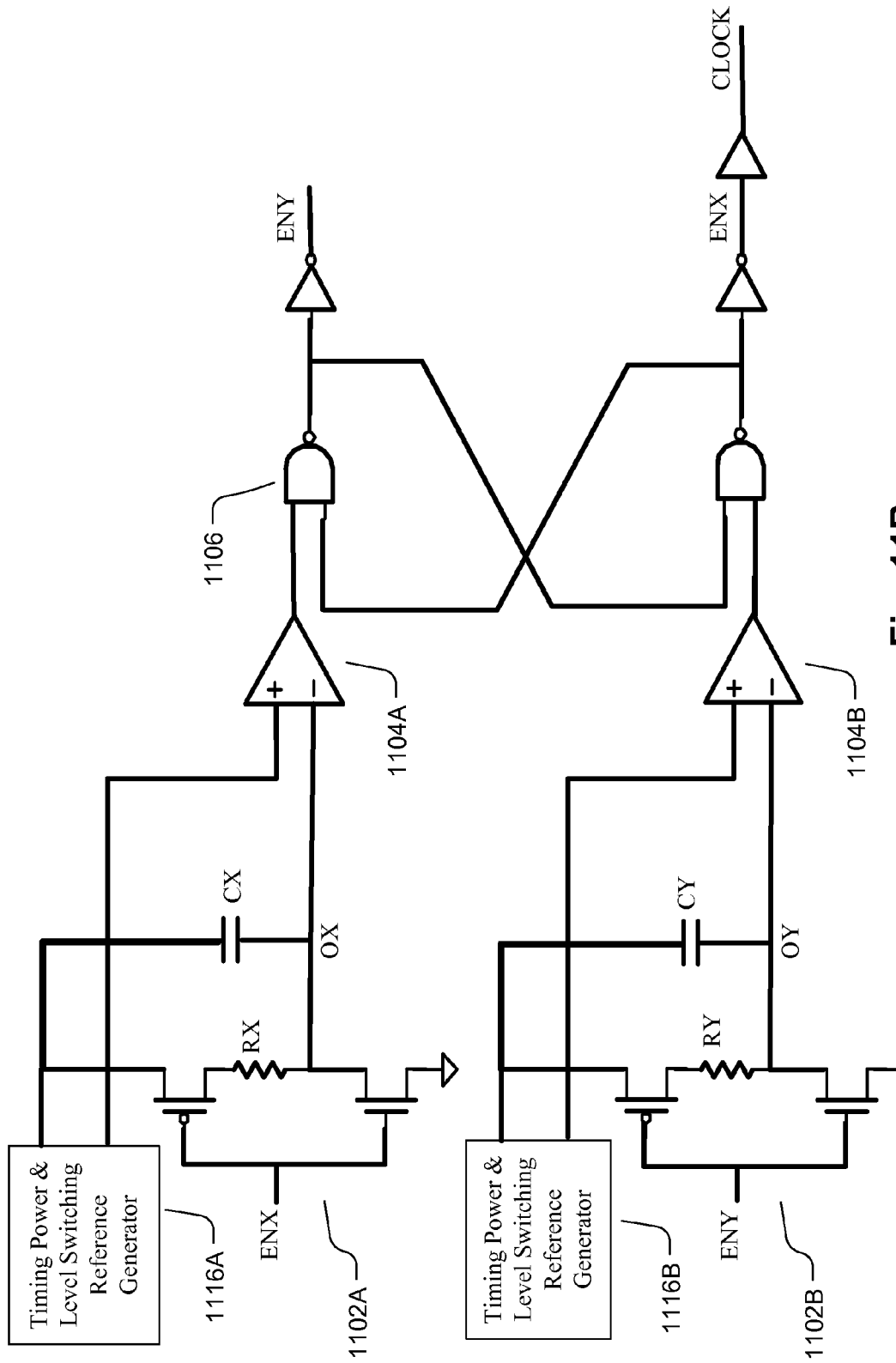

FIGS. 11A and 11B are circuit diagrams of an integrated clock circuit with tolerance to power noise, including transistors that share a common noise phase of power noise in the timing circuitry power, and power noise in the reference signal used in level detection of the timing circuitry output.

Shown are parallel instances of timing circuitry 1102A and 1102B, parallel instances of level switching circuitry 1104A and 1104B, and the latch circuitry 1106. Also shown are parallel instances of timing power and level switching generator 1116A and 1116B, which generate power noise with the same noise phase in both the power noise in the timing circuitry power, and the power noise in the reference signal used in level detection of the timing circuitry output.

In FIG. 11A the capacitance circuitry CX or CY is coupled towards ground. In FIG. 11B the capacitance circuitry CX or CY is coupled towards power 1116A or 1116B.

Figure 12:
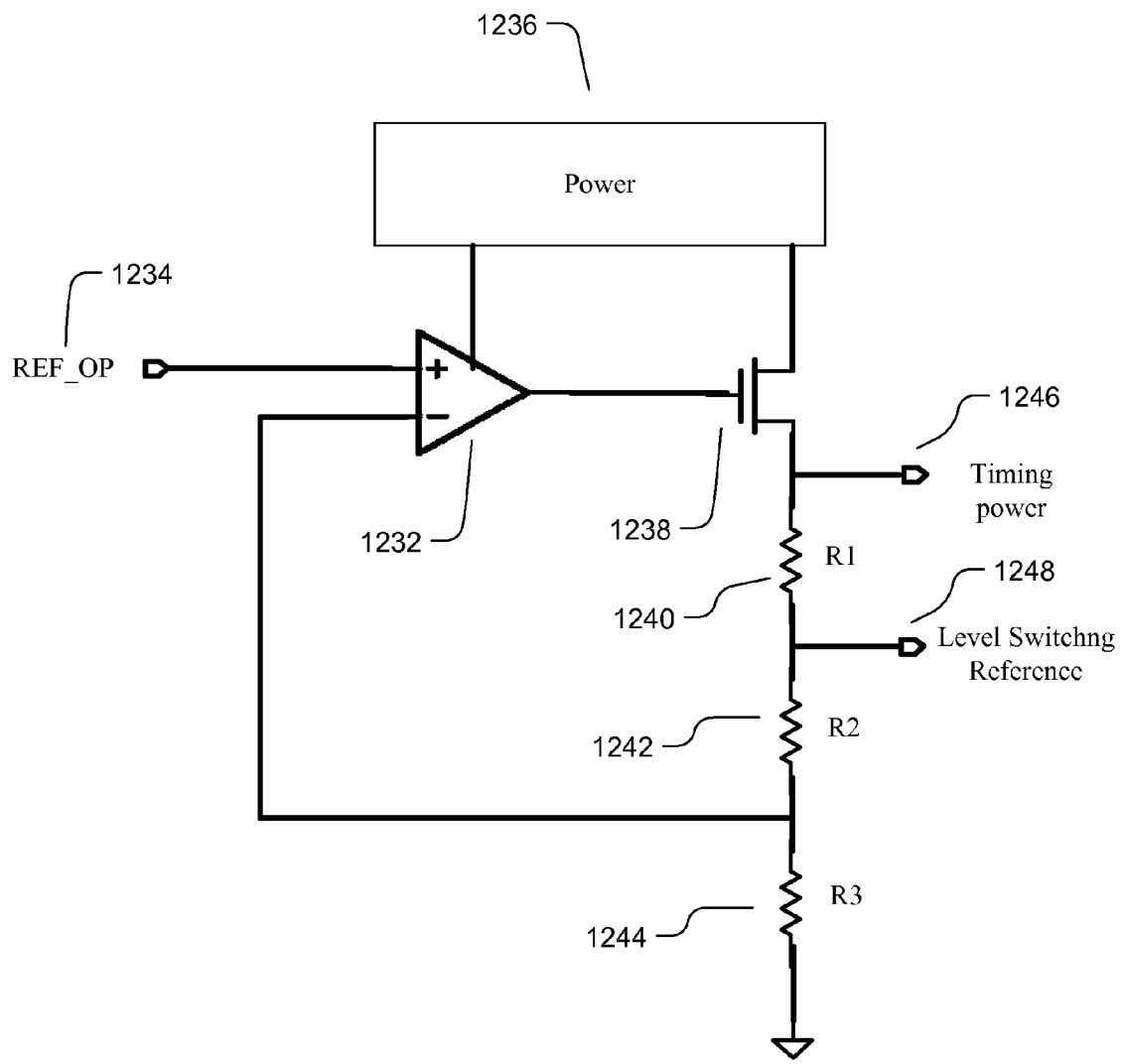
FIG. 12 is a circuit diagram of the power circuitry that shares the common noise phase of power noise to in the timing circuitry power, and power noise to in the reference signal used in level detection of the timing circuitry output.

FIG. 12 is a circuit diagram of the power circuitry that shares the common noise phase of power noise in the timing circuitry power, and power noise in the reference signal used in level detection of the timing circuitry output.

FIG. 12 shows a power source 1236, driving an op amp 1232. The op amp has a reference signal REF_OP 1234 in the noninverting input. An example of REF_OP 1234 is a bandgap reference circuit at 1.3 V. A MOFET 1238 has a gate coupled to the output of op amp 1232, a drain coupled to the power source 1236, and a source coupled to the timing power output 1246. The timing power output 1246 is separated by resistor R1 1240 from the level switching reference 1248. Resistor R2 1242 separates the level switching reference 1248 from the negative feedback point of the op amp 1232. Finally, resistor R3 couples this feedback point to ground.

Another embodiment employs capacitive coupling with a floating node to maintain the same noise phase between the timing power output 1246 and the level switching reference

1248, where one of the timing power output 1246 and the level switching reference 1248 is floating.

Although the above embodiments are specifically designed to maintain the same noise phase between the timing power output 1246 and the level switching reference 1248, this is not the case in other designs. Such other designs have different noise phase between the timing power output and the level switching reference 1248, for one or more various reasons: (1) the reference circuit is not near the timing circuit due to the chip plan; (2) the reference circuit is a regulator which has better PSRR (power supply rejection ratio) than VDD power; and (3) even with a power regulator for the RC power, a noise phase difference remains, due to the different output loading and transient, and the power regulator having to support larger current and larger output transient.

Figure 13:
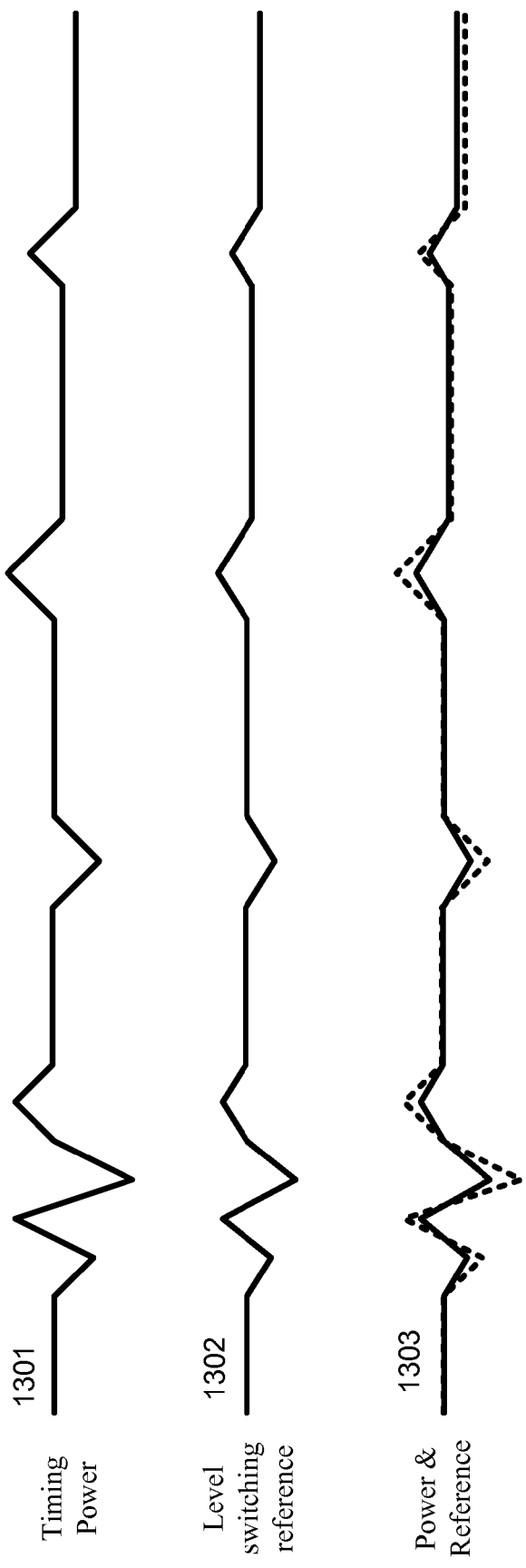
FIG. 13 is a set of graphs of voltage versus time, showing how power noise has the same phase in both the timing circuitry power, and the reference signal used in level detection of the timing circuitry output, due to circuitry such as in FIGS. 11 and 12.

FIG. 13 is a set of graphs of voltage versus time, showing how power noise has the same phase in both the timing circuitry power, and the reference signal used in level detection of the timing circuitry output, due to circuitry such as in FIGS. 11 and 12.

The same noise phase is shown in both the power noise in the timing circuitry power 1301, and the power noise in the reference signal used in level detection of the timing circuitry output 1302. Trace 1303 overlaying traces 1301 and 1302 show that, although the magnitudes of the power noise vary, the peaks and valleys are synchronous in the power noise between traces 1301 and 1302.

Figure 14:
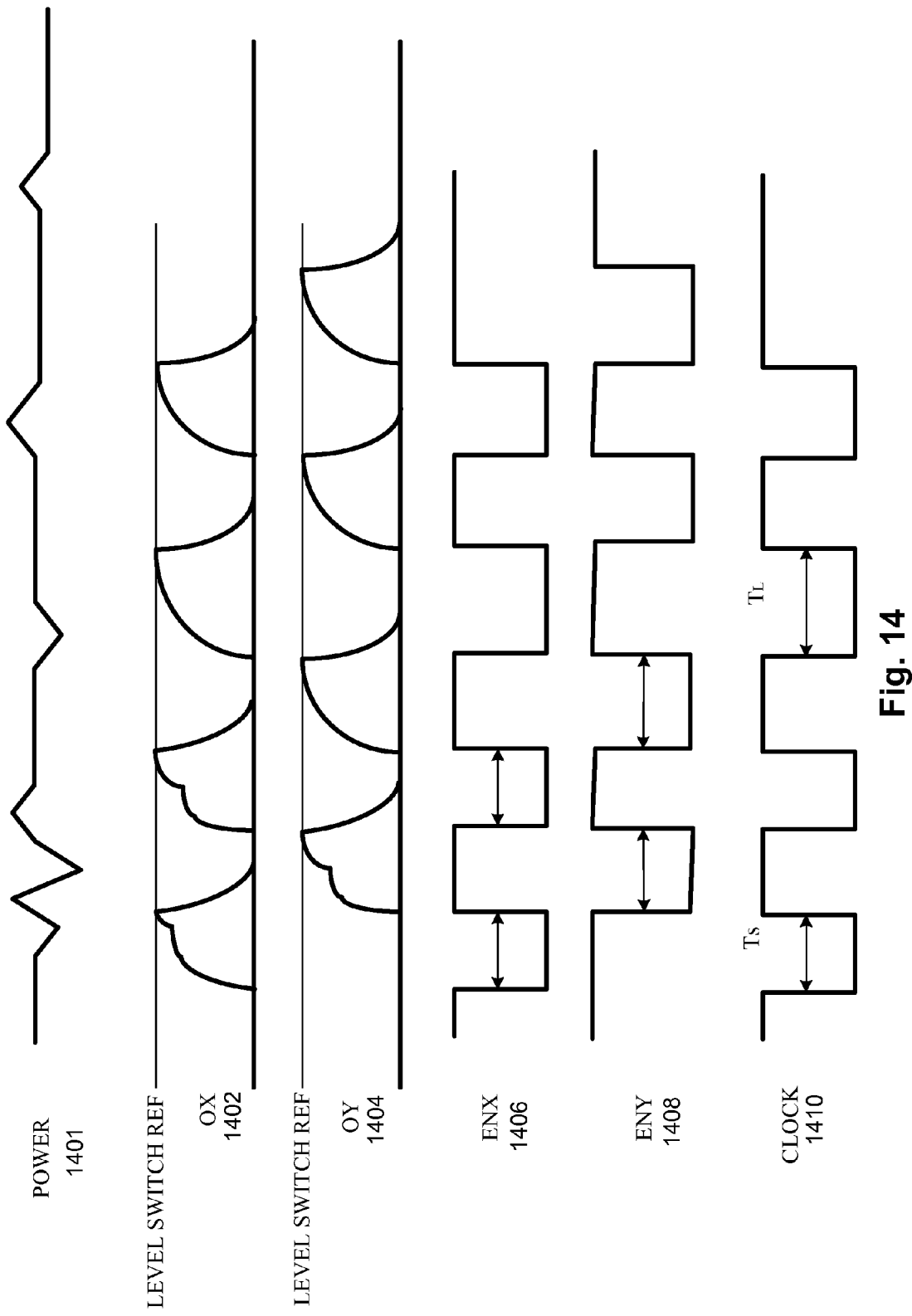
FIG. 14 is a set of graphs of voltage versus time, showing how clock circuitry that is intolerant of power noise, will generate clock timing that varies widely with time-varying power noise.

FIG. 14 is a set of graphs of voltage versus time, showing how clock circuitry that is intolerant of power noise, will generate clock timing that varies widely with time-varying power noise.

FIG. 14 shows how traces OX and OY are affected by power noise 1401. When there is a dip in power noise, then the process of the timing circuit charging from REF_LO to REF_HI gets a head start, resulting in less time being required for the timing circuit to charge from REF_LO to REF_HI. Similarly, when there is a peak in power noise, then the process of the timing circuit charging from REF_LO to REF_HI gets slowed, resulting in more time being required for the timing circuit to charge from REF_LO to REF_HI. These variations follow from the constant level switching reference. Accordingly, the resulting clock signal output 1410 has a wide variation in clock period.

Figure 15:
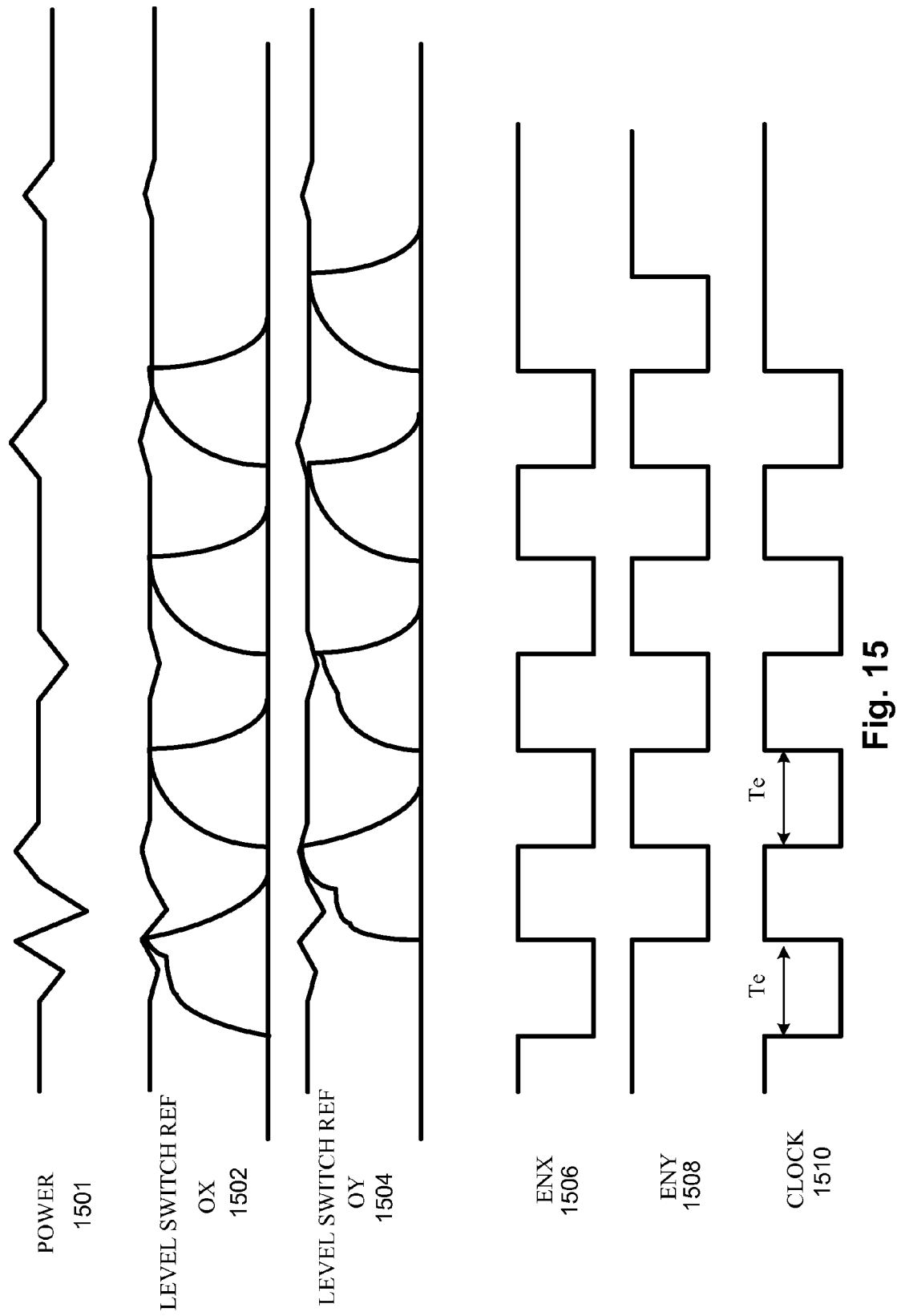
FIG. 15 is a set of graphs of voltage versus time, showing how clock circuitry that is tolerant of power noise, will generate clock timing that is fairly constant with time-varying power noise, due to circuitry such as that in FIGS. 11 and 12.

FIG. 15 is a set of graphs of voltage versus time, showing how clock circuitry that is tolerant of power noise, will generate clock timing that is fairly constant with time-varying power noise, due to circuitry such as that in FIGS. 11 and 12.

FIG. 15 shows how traces OX and OY are affected by ground noise. Unlike in FIG. 14, when there is a peak or other variation in power noise 1501, there is a synchronous has peak or other variation in the level switching reference. Although the magnitude of these peaks or other variations are lessened in the level switching reference, as compared to that of the power noise, the synchronous nature of the power noise between the timing circuitry power 1501 and the level switching reference substantially decreases the clock signal variation. Accordingly, the resulting clock signal output 1510 has a common clock period during a wide variation in ground noise.

Figure 16A:
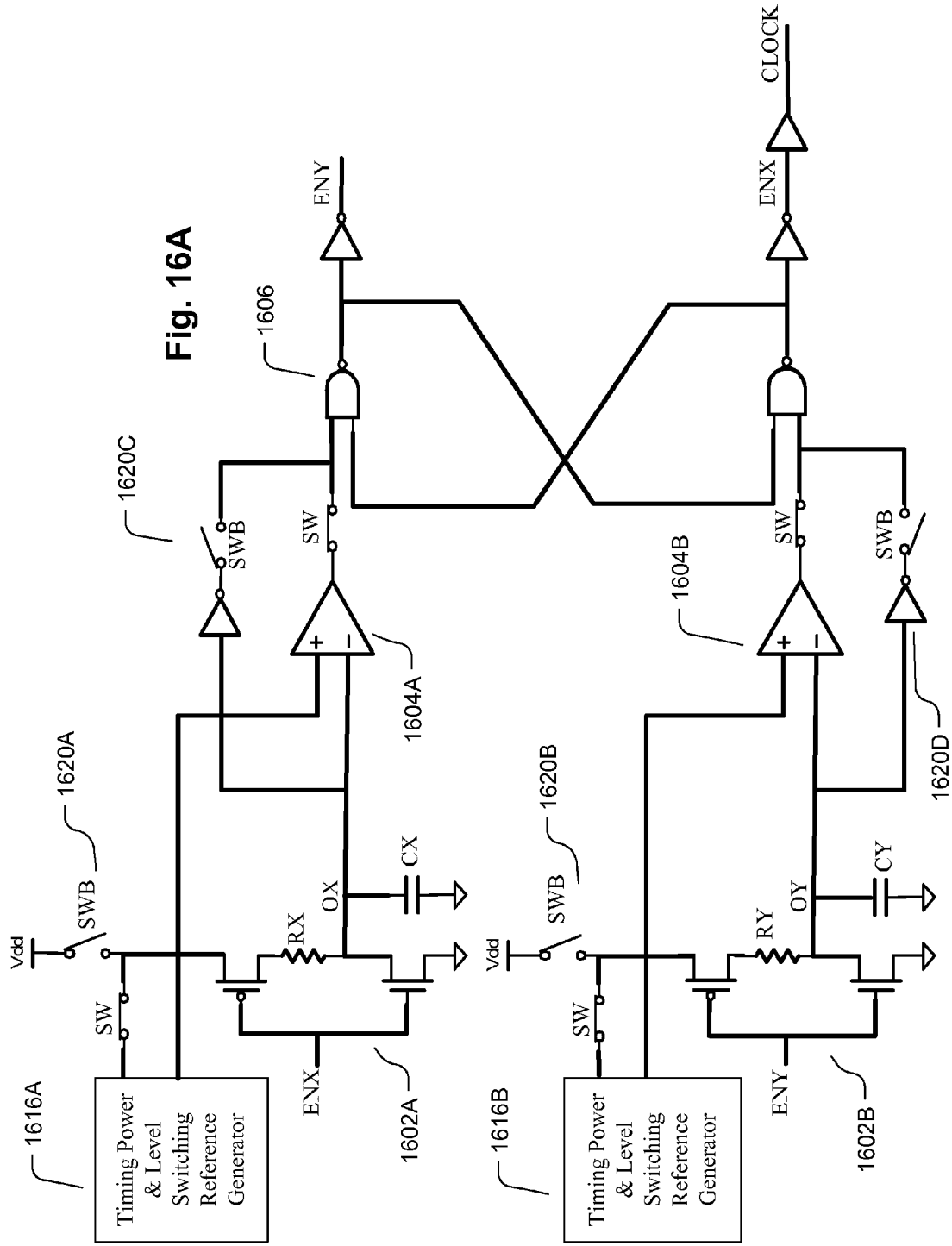
Figure 16B:
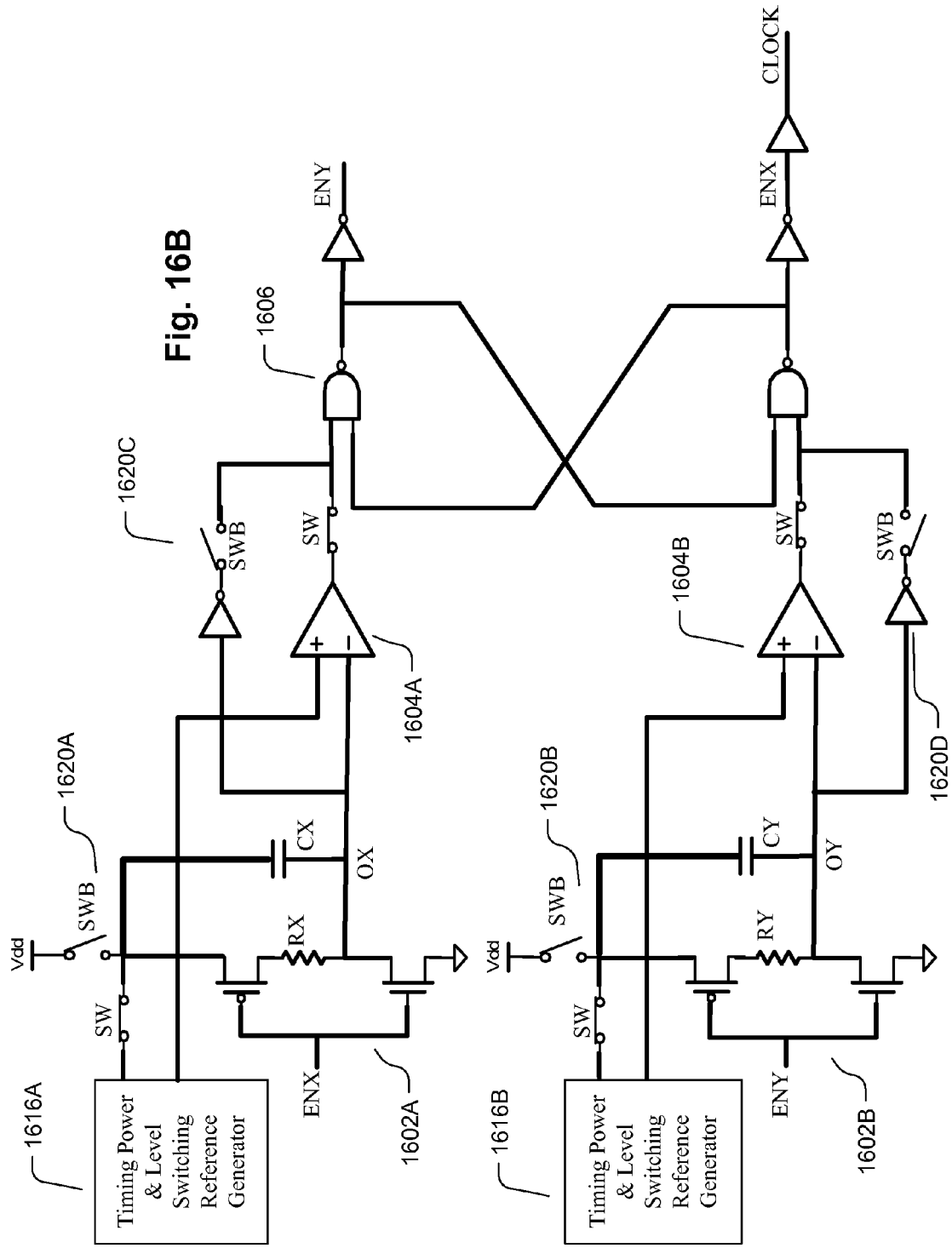

FIGS. 16A and 16B are circuit diagrams of an integrated clock circuit to switch the power of the clock. During power on, the stable power isn't ready, and needs the VDD power to generate the clock for the logic circuits. Logic circuitry waits for the stable power setup timing. When the stable power is ready, then the clock will switch to a stable clock.

Shown are parallel instances of timing circuitry 1602A and 1602B, parallel instances of level switching circuitry 1604A and 1604B, and the latch circuitry 1606. Also shown are parallel instances of timing power and level switching generator 1616A and 1616B, which generate power noise with the same noise phase in both the power noise in the timing circuitry power, and the power noise in the reference signal used in level detection of the timing circuitry output. Also shown are switches 1620A between the VDD and the timing power and level switching generator 1616A, switches 1620B between the VDD and the timing power and level switching generator 1616B, switches 1620C between different types of level switching circuitry 1604A and the latch 1606, and switches 1620D between different types of level switching circuitry 1604B and the latch 1606.

In FIG. 16A the capacitance circuitry CX or CY is coupled towards ground. In FIG. 16B the capacitance circuitry CX or CY is coupled towards power 1616A or 1616B.

Figure 17:
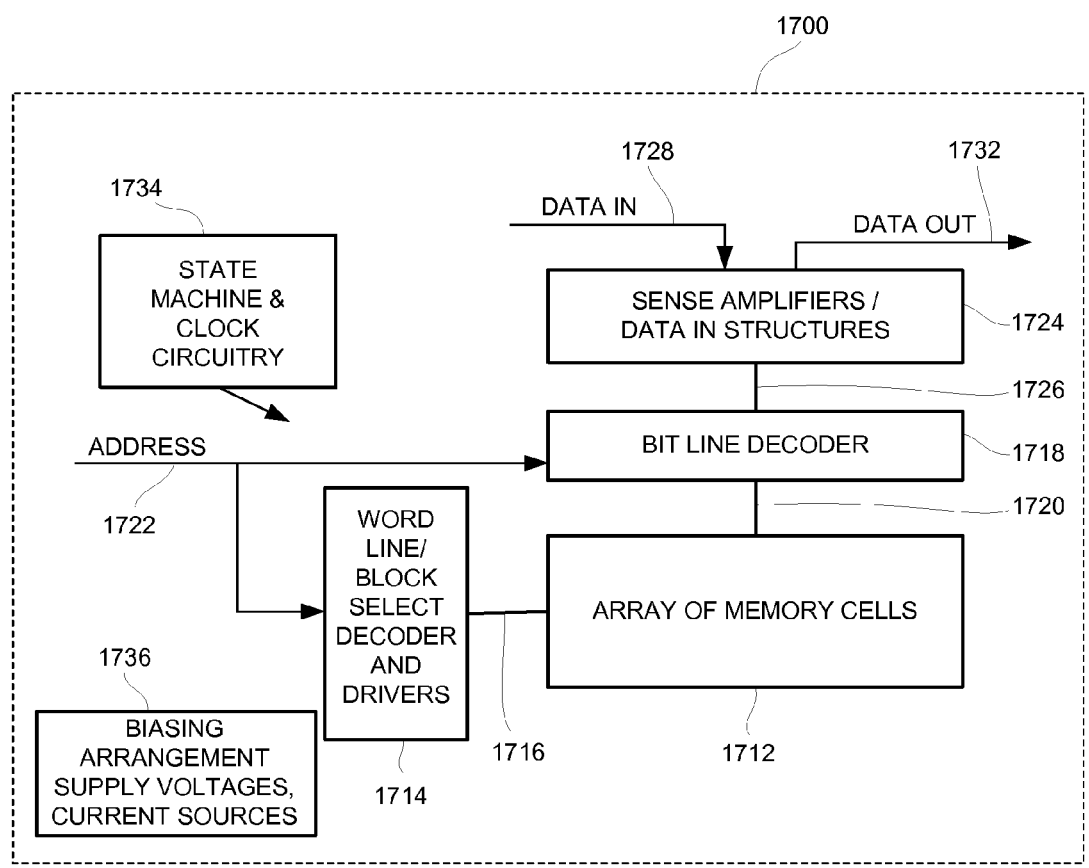
FIG. 17 is block diagram of a memory circuit with an improved integrated clock circuit as discussed herein.

FIG. 17 is block diagram of a memory circuit with an improved integrated clock circuit as discussed herein.

FIG. 17 is a simplified block diagram of an integrated circuit 1700 including a memory array 1712. A word line (or row) and block select decoder 1714 is coupled to, and in electrical communication with, a plurality 1716 of word lines and string select lines, and arranged along rows in the memory array 1712. A bit line (column) decoder and drivers 1718 are coupled to and in electrical communication with a plurality of bit lines 1720 arranged along columns in the memory array 1712 for reading data from, and writing data to, the memory cells in the memory array 1712. Addresses are supplied on bus 1722 to the word line decoder and drivers 1714 and to the bit line decoder 1718. Sense amplifiers and data-in structures in block 1724, including current sources for the read, program and erase modes, are coupled to the bit line decoder 1718 via the bus 1726. Data is supplied via the data-in line 1728 from input/output ports on the integrated circuit 1710, to the data-in structures in block 1724. In the illustrated embodiment, other circuitry 1730 is included on the integrated circuit 1700, such as a general purpose processor or special purpose application circuitry, or a combination of modules providing system-on-a-chip functionality supported by the memory cell array. Data is supplied via the data-out line 1732 from the sense amplifiers in block 1724 to input/output ports on the integrated circuit 1700, or to other data destinations internal or external to the integrated circuit 1700. State machine and improved clock circuitry (as discussed herein) are in circuitry 1734, controlling biasing arrangement supply voltages and current sources 1736.

Figure 18:
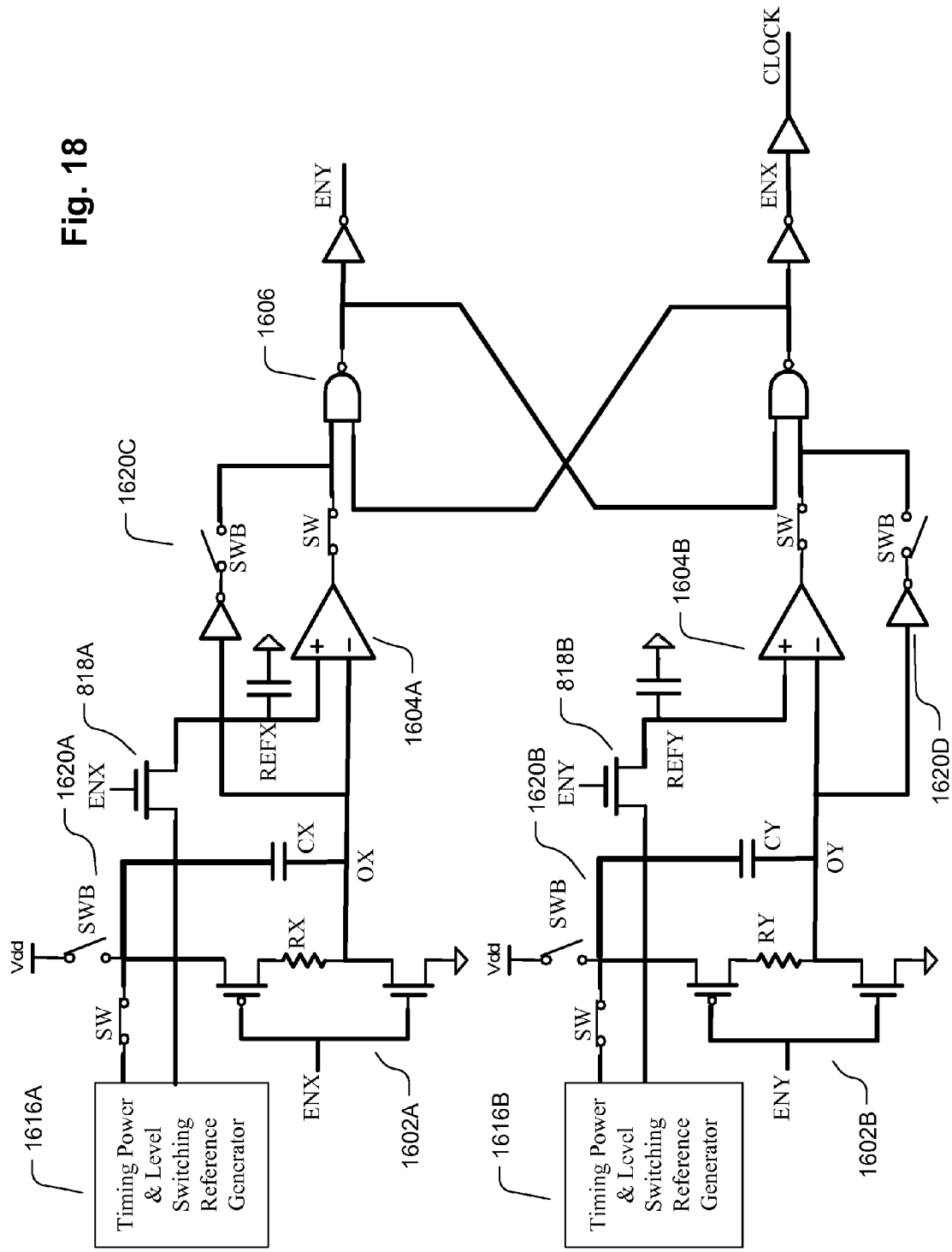
FIG. 18 is a circuit diagram, similar to FIG. 16, of an integrated clock circuit with tolerance to power noise, and further including switching circuitry between the reference generator and the op amp.

FIG. 18 is a circuit diagram, similar to FIG. 16, of an integrated clock circuit with tolerance to power noise, and further including switching circuitry between the reference generator and the op amp. As in FIG. 8, the switching transistor 818A is turned on by signal ENX and the switching transistor 818B is turned on by signal ENY. Similar to FIG. 8, ground noise coming from the timing power and level switching generator 1616A and 1616B is stored in the capacitive node REF X or REFY.

FIG. 19A is a circuit diagram of an exemplary power circuit generating a voltage reference for the clock circuitry, such as for comparison circuitry which precedes latch circuitry.

A current source 1902 controls the current of the left part of current mirror 1904, thereby controlling the current of the right part of current mirror 1904. This current causes a voltage drop across the resistor 1908, down from supply voltage 1906. Because the current through the resistor 1908 is fixed according to the current mirror 1904 and the current source 1902, the resistor 1908 tends to experience the same amount of voltage drop, regardless of the supply voltage 1906.

FIG. 19B is a graph of the voltage reference generated by the power circuit of FIG. 19A, showing the strong dependence of the voltage reference on the supply voltage VDD.

Because the resistor 1908 tends to experience the same amount of voltage drop, regardless of the supply voltage 1906, the output voltage reference V_ref 1910 tends to rise up and down to follow changes in the supply voltage 1906.

FIG. 20A is a circuit diagram of an exemplary timing circuit with a time constant, such as for determining clock timing of a clock circuit.

The output 2016 is part of a timing circuit with a time constant, in this example an RC time constant defined by the resistance 2012 and capacitance 2014. IN this example, the timing circuit alternates between rising toward the supply voltage Vdd, and falling toward ground.

FIG. 20B is a graph of the timing circuit output generated by the timing circuit of FIG. 20A, showing a dependence of the voltage reference on the supply voltage VDD, where the dependence is weaker than for FIG. 19B.

When VDD changes, the timing circuit rises toward the changed supply voltage VDD, and falls from the changed supply voltage VDD. Although the time constant remains constant if the component resistance and capacitance remain constant, the rising and falling curves scale directly proportionally as a function of the changed supply voltage VDD.

Comparison of FIGS. 19 and 20 shows that, when the supply voltage changes, such as with increased VDD, both the voltage reference V_ref and the timing circuit curve also increase. However, as a ratio of the supply voltage change, the voltage reference V_ref increase is larger than the increase at various points of the time constant curve. This difference results from the voltage reference V_ref tending to experience changes that directly follow the changes in the supply voltage VDD, whereas only the limit of the timing circuit curve tends to experience changes that directly follow the changes in the supply voltage VDD. An actual non-theoretical physical system will not wait until the timing circuit reaches the limit. Parts of the timing circuit curve that are only approaching the limit—the whole curve in an actual non-theoretical physical system—will change by an amount less than the changes in the supply voltage VDD.

Figure 21:
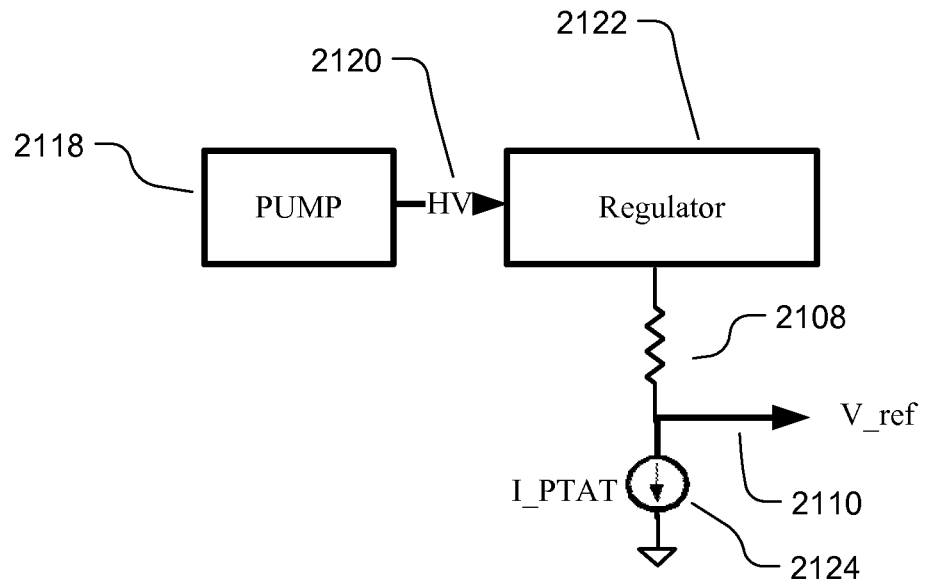
FIG. 21 is a circuit diagram of an exemplary power circuit which relies on a voltage pump generating a high voltage from a low supply voltage, and voltage regulator circuitry, to generate a voltage reference for clock circuitry, such as for comparison circuitry which precedes latch circuitry.

FIG. 21 is a circuit diagram of an exemplary power circuit which relies on a voltage pump generating a high voltage from a low supply voltage, and voltage regulator circuitry, to generate a voltage reference for clock circuitry, such as for comparison circuitry which precedes latch circuitry.

In the circuit design of FIG. 21, the precise clock draws on regulated power to limit the clock frequency variation due to the system VDD variation. A voltage pump 2118 raises system VDD to a high voltage 2120. The regulator 2122 receives the high voltage 2120 and smoothes out variation. The overall circuit has as output the voltage reference V_ref 2110, which is based on the output of the regulator 2122, minus a voltage drop across resistor 2108. The voltage drop across resistor 2108 is determined by the current source I_PTAT to generate a Vref that limits the clock frequency variation due to temperature variation.

Figure 22:
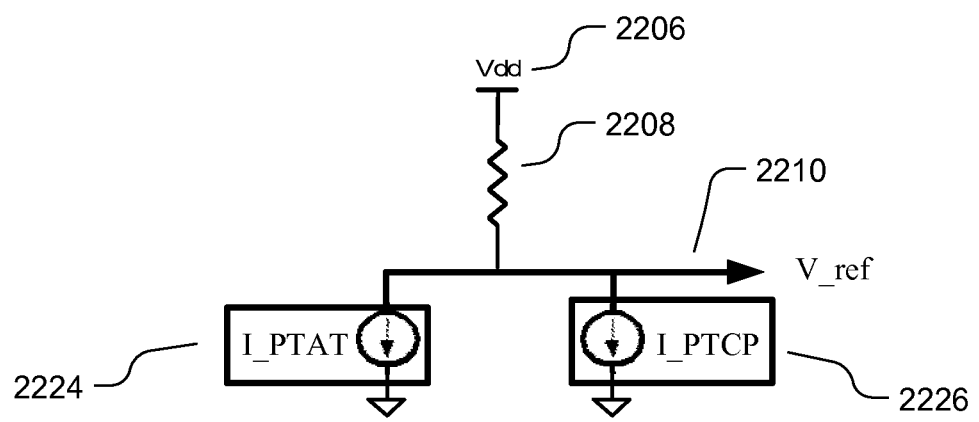
FIG. 22 is a circuit diagram of an exemplary improved power circuit that generates a voltage reference for clock circuitry, where the voltage reference is compensated for variation in the supply voltage via one current source, and the voltage reference is compensated for variation in temperature via another current source.

FIG. 22 is a circuit diagram of an exemplary improved power circuit that generates a voltage reference for clock circuitry, where the voltage reference is compensated for variation in the supply voltage via one current source, and the voltage reference is compensated for variation in temperature via another current source.

In the circuit design of FIG. 22, in addition to the current source I_PTAT 2224 which was shown also in FIG. 21 that compensates for variation in temperature, another current source I_PTCP (Proportional To Circuit Power) 2226 compensates for variation in the supply voltage. The additional current source I_PTCP helps to compensate for changes in the supply voltage VDD that have a large effect on the voltage reference V_ref then on timing circuit curve obeying a time constant. The combination of the I_PTAT current source and the I_PTCP current source compensates for variation in both VDD supply voltage 2206 and temperature variation. The combination of the I_PTAT current source and the I_PTCP current source generates a voltage drop from the supply voltage 2206 across the resistor 2208, to generate a voltage reference V_ref 2210.

Figure 23:
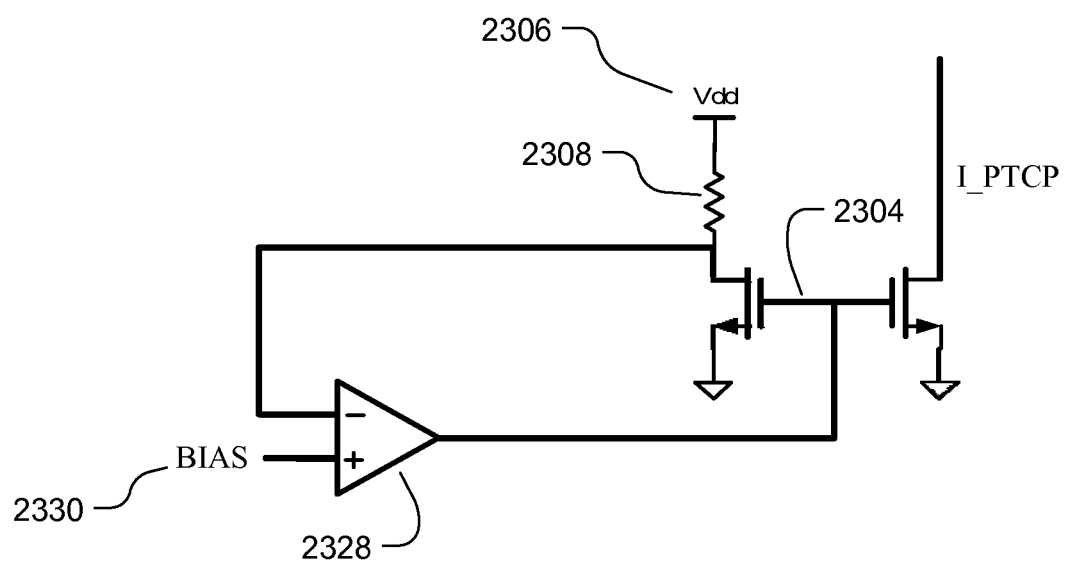
FIG. 23 is a circuit diagram of an exemplary current source that compensates the voltage reference for variation in the supply voltage.

Vref_PTCP can be independent from the temperature variation due to use the same type resistance FIG. 23 is a circuit diagram of an exemplary current source that compensates the voltage reference for variation in the supply voltage.

The current through the resistor 2308 is determined by the voltage difference across the resistor. This voltage difference is between the supply voltage Vdd 2306 and the voltage at the inverting input of the op amp 2328. The voltage at the inverting input of the op amp 2328 is the same as the voltage at the noninverting input of the op amp 2328. The voltage at the noninverting input of the op amp 2328 is the BIAS voltage 2330, which is a constant voltage, such as a bandgap circuit output.

So the current through the resistor 2308 is I=(VDD−BIAS)/R. When VDD increases, the output current I_PTCP (Proportional to Circuit Power) of the current source increases. I_PTCP is an example of I_PTCP.

Figure 24:
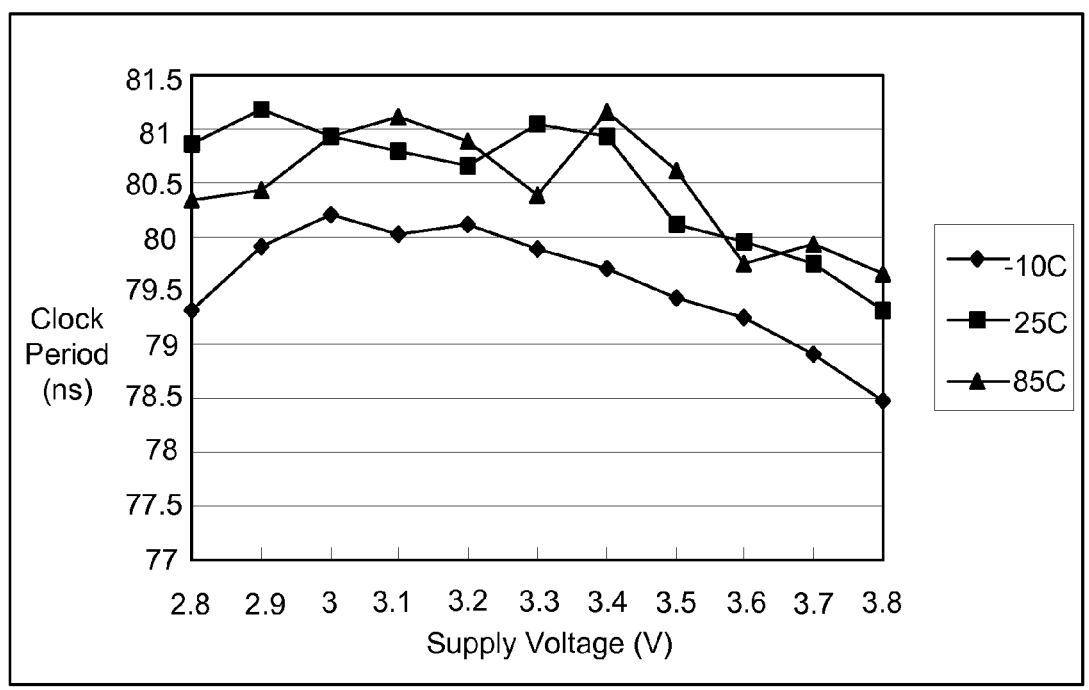
FIG. 24 is a graph of clock period versus supply voltage for various temperatures, demonstrating the effectiveness of the technology that compensates the voltage reference for variation in the supply voltage.

FIG. 24 is a graph of clock period versus supply voltage for various temperatures, demonstrating the effectiveness of the technology that compensates the voltage reference for variation in the supply voltage.

The data show that this technology keeps the clock period between 79 ns~81 ns despite a variation in system voltage between (2.9V, 3.6V), and despite a variation in temperature between (−10 C, 85 C).

Figure 25:
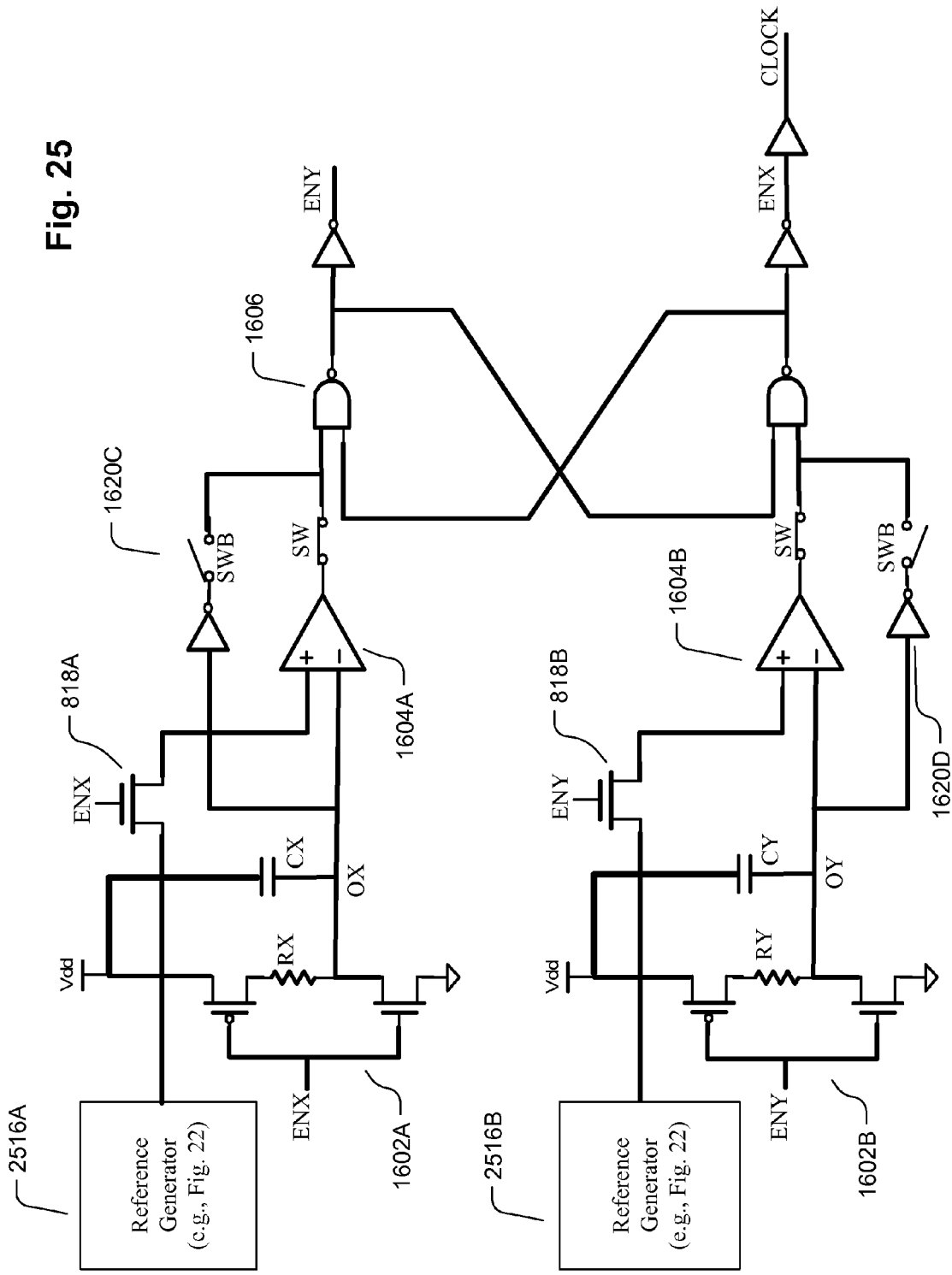
FIG. 25 is a circuit diagram, similar to FIG. 16, of an integrated clock circuit with tolerance to supply voltage fluctuation.

FIG. 25 is a circuit diagram, similar to FIG. 16, of an integrated clock circuit with tolerance to supply voltage fluctuation. Shown are parallel instances of timing circuitry 1602A and 1602B, parallel instances of level switching circuitry 1604A and 1604B, and the latch circuitry 1606. The timing circuitry 1602A and 1602B powered by Vdd is generally an inverter with resistance RX or RY, charging to or discharging from capacitance CX or CY, to change the output voltage at OX or OY. As in FIG. 8, the switching transistor 818A is turned on by signal ENX and the switching transistor 818B is turned on by signal ENY. Reference generator 2516A and 2516B provide a fluctuation compensated supply voltage, such as in FIG. 22. This embodiment includes switches 1620C between different types of level switching circuitry 1604A (op amp and inverter) and the latch 1606, and switches 1620D between different types of level switching circuitry 1604B (op amp and inverter) and the latch 1606.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
   a clock integrated circuit generating a clock signal, comprising:

a compensation circuit generating a compensated voltage reference, the compensation circuit powered by a supply voltage, the compensated voltage reference is compensated for variation in the supply voltage;

timing circuitry having an output alternating between the compensated voltage reference and a bias level at a rate determined by a time constant; and comparison circuitry comparing the output of the timing circuitry against the compensated voltage reference, wherein the timing circuitry and the comparison circuitry determine timing of the clock signal.

2. The apparatus of claim 1, wherein responsive to a first voltage change in the supply voltage, the compensated voltage reference has a second voltage change, the second voltage change having a lower magnitude than the first voltage change.

3. The apparatus of claim 1, wherein the compensated voltage reference is compensated for variation in the supply voltage and for variation in temperature.

4. The apparatus of claim 1, wherein the compensation circuit includes a current source with an output current that varies with changes in the supply voltage.

5. The apparatus of claim 1, wherein the compensation circuit includes:
a first current source with an output current that varies with changes in the supply voltage; and
a second current source with an output current that varies with changes in temperature.

6. The apparatus of claim 1, wherein the compensation circuit includes a current source with an output current that increases with a positive voltage change in the supply voltage.

7. The apparatus of claim 1, wherein the compensation circuit includes a current source with an output current that decreases with a positive voltage change in the supply voltage.

8. The apparatus of claim 1, wherein the supply voltage is unregulated.

9. The apparatus of claim 1, wherein the supply voltage is unpumped.

10. The apparatus of claim 1, wherein the clock integrated circuit further comprises:
a latch generating the clock signal of the clock integrated circuit, the latch including cross-coupled gates, such that outputs of the cross-coupled gates in the latch are coupled to inputs of different cross-coupled gates in the latch, the latch having an input coupled to an output of the comparison circuitry.

11. A method of generating a clock signal from a clock integrated circuit, comprising:
generating a compensated voltage reference, the compensated voltage reference being compensated for variation in a supply voltage;
alternating a timing circuitry output between the compensated voltage reference and a bias level at a rate determined by a time constant; and
comparing the output of the timing circuitry against the compensated voltage reference,
said alternating and said comparing determine timing of the clock signal.

12. The method of claim 11, wherein responsive to a first voltage change in the supply voltage, the compensated voltage reference has a second voltage change, the second voltage change having a lower magnitude than the first voltage change.

13. The method of claim 11, wherein the compensated voltage reference is compensated for variation in the supply voltage and for variation in temperature.

14. The method of claim 11, wherein the compensation circuit includes a current source with an output current that varies with changes in the supply voltage.

15. The method of claim 11, wherein:
the compensated voltage reference is generated by varying an output current of a first current source with changes in the supply voltage, and by varying an output current of a second current source with changes in temperature.

16. The method of claim 11, wherein:
the compensated voltage reference is generated by varying an output current of a current source that increases with a positive voltage change in the supply voltage.

17. The method of claim 11, wherein:
the compensated voltage reference is generated by varying an output current of a current source that decreases with a positive voltage change in the supply voltage.

18. The method of claim 11, wherein the supply voltage is unregulated.

19. The method of claim 11, wherein the supply voltage is unpumped.

20. The method of claim 11, further comprising:
generating the clock signal of the clock integrated circuit from a latch including cross-coupled gates, such that outputs of the cross-coupled gates in the latch are coupled to inputs of different cross-coupled gates in the latch, the latch responsive to said comparing.

21. An apparatus generating a clock signal from a clock integrated circuit, comprising:
means for generating a compensated voltage reference, the compensated voltage reference being compensated for variation in a supply voltage;
means for alternating a timing circuitry output between the compensated voltage reference and a bias level at a rate determined by a time constant; and
means for comparing the output of the timing circuitry against the compensated voltage reference,
said means for alternating and said means for comparing determining timing of the clock signal.

* * * * *